United States Patent
Chowdhury et al.

(10) Patent No.: US 10,224,407 B2
(45) Date of Patent: Mar. 5, 2019

(54) HIGH VOLTAGE FIELD EFFECT TRANSISTOR WITH LATERALLY EXTENDED GATE DIELECTRIC AND METHOD OF MAKING THEREOF

(71) Applicant: SANDISK TECHNOLOGIES LLC, Plano, TX (US)

(72) Inventors: Murshed Chowdhury, Fremont, CA (US); Andrew Lin, San Jose, CA (US); James Kai, Santa Clara, CA (US); Yanli Zhang, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/444,725

(22) Filed: Feb. 28, 2017

(65) Prior Publication Data
US 2018/0248013 A1   Aug. 30, 2018

(51) Int. Cl.
*H01L 21/28*     (2006.01)
*H01L 29/08*     (2006.01)
(Continued)

(52) U.S. Cl.
CPC .... *H01L 29/4236* (2013.01); *H01L 21/28158* (2013.01); *H01L 29/0847* (2013.01); *H01L 29/1037* (2013.01); *H01L 29/401* (2013.01); *H01L 29/4983* (2013.01); *H01L 29/6659* (2013.01); *H01L 29/66621* (2013.01); *H01L 29/7833* (2013.01); *H01L 29/7834* (2013.01)

(58) Field of Classification Search
None
See application file for complete search history.

(56) References Cited

U.S. PATENT DOCUMENTS 4,316,203 A   2/1982  Tohgi
4,322,822 A   3/1982  McPherson
(Continued)

FOREIGN PATENT DOCUMENTS

EP        0043943 A2    1/1982

OTHER PUBLICATIONS

International Search Report and Written Opinion of the International Searching Authority for International Patent Application No. PCT/US2017/062477, dated Feb. 2, 2018, 15 pages.
(Continued)

*Primary Examiner* — Erik Kielin
(74) *Attorney, Agent, or Firm* — The Marbury Law Group PLLC

(57) ABSTRACT

A trench having a uniform depth is provided in an upper portion of a semiconductor substrate. A continuous dielectric material layer is formed, which includes a gate dielectric that fills an entire volume of the trench. A gate electrode is formed over the gate dielectric such that the gate electrode overlies a center portion of the gate dielectric and does not overlie a first peripheral portion and a second peripheral portion of the gate dielectric that are located on opposing sides of the center portion of the gate dielectric. After formation of a dielectric gate spacer, a source extension region and a drain extension region are formed within the semiconductor substrate by doping respective portions of the semiconductor substrate.

16 Claims, 15 Drawing Sheets

(51) Int. Cl.
*H01L 29/10* (2006.01)
*H01L 29/40* (2006.01)
*H01L 29/49* (2006.01)
*H01L 29/66* (2006.01)
*H01L 29/78* (2006.01)
*H01L 29/423* (2006.01)

(56) References Cited

U.S. PATENT DOCUMENTS

| | | |
|---|---|---|
| 4,502,208 A | 3/1985 | McPherson |
| 4,550,490 A | 11/1985 | Blossfeld |
| 4,914,743 A | 4/1990 | Yoder et al. |
| 4,916,498 A | 4/1990 | Berenz |
| 4,939,557 A | 7/1990 | Pao et al. |
| 5,124,764 A | 6/1992 | Mori |
| 5,181,087 A | 1/1993 | Usagawa et al. |
| 5,373,191 A | 12/1994 | Usagawa et al. |
| 5,508,209 A | 4/1996 | Zhang et al. |
| 5,663,582 A | 9/1997 | Nishizawa et al. |
| 5,741,735 A | 4/1998 | Violette et al. |
| 5,766,969 A | 6/1998 | Fulford, Jr. et al. |
| 5,888,859 A | 3/1999 | Oku et al. |
| 5,962,872 A | 10/1999 | Zhang et al. |
| 6,104,063 A | 8/2000 | Fulford, Jr. et al. |
| 6,169,011 B1 | 1/2001 | Hsu |
| 6,784,515 B1 | 8/2004 | Li |
| 9,305,934 B1 | 4/2016 | Ding et al. |
| 9,449,987 B1 | 9/2016 | Miyata et al. |
| 9,741,850 B1* | 8/2017 | Hsiao .................. H01L 29/7835 |
| 2002/0053695 A1 | 5/2002 | Liaw et al. |
| 2002/0072174 A1 | 6/2002 | Sandhu et al. |
| 2002/0151144 A1 | 10/2002 | Takasu et al. |
| 2003/0067050 A1 | 4/2003 | Kim |
| 2003/0080348 A1 | 5/2003 | Inai et al. |
| 2004/0067619 A1 | 4/2004 | Niimi et al. |
| 2004/0106259 A1 | 6/2004 | Sandhu et al. |
| 2004/0266111 A1 | 12/2004 | Lee |
| 2005/0035470 A1* | 2/2005 | Ko .................. H01L 21/823807 |
| | | 257/368 |
| 2005/0062104 A1 | 3/2005 | Kim et al. |
| 2005/0085020 A1 | 4/2005 | Zhang et al. |
| 2005/0139868 A1 | 6/2005 | Anda |
| 2006/0113627 A1 | 6/2006 | Chen et al. |
| 2006/0141726 A1 | 6/2006 | Kim et al. |
| 2006/0148183 A1 | 7/2006 | Choi |
| 2007/0122957 A1 | 5/2007 | Anderson et al. |
| 2007/0161187 A1 | 7/2007 | Hwang et al. |
| 2007/0200171 A1 | 8/2007 | Tanaka et al. |
| 2008/0001204 A1 | 1/2008 | Lee et al. |
| 2008/0023752 A1 | 1/2008 | Chen et al. |
| 2008/0028521 A1 | 2/2008 | Mehta |
| 2008/0185634 A1 | 8/2008 | Li et al. |
| 2008/0197410 A1 | 8/2008 | Chiang et al. |
| 2008/0248621 A1 | 10/2008 | Kai et al. |
| 2009/0014789 A1 | 1/2009 | Manabe |
| 2009/0057766 A1 | 3/2009 | Lu et al. |
| 2009/0072299 A1 | 3/2009 | Choi |
| 2009/0114966 A1 | 5/2009 | Renn |
| 2009/0170266 A1 | 7/2009 | Lee |
| 2010/0003797 A1 | 1/2010 | Smith |
| 2010/0044752 A1 | 2/2010 | Marui |
| 2010/0044790 A1 | 2/2010 | Kato et al. |
| 2010/0053517 A1 | 3/2010 | Imai et al. |
| 2010/0109015 A1 | 5/2010 | Ueno |
| 2010/0227469 A1 | 9/2010 | Hwang et al. |
| 2010/0244044 A1 | 9/2010 | Li et al. |
| 2010/0301395 A1 | 12/2010 | Xu et al. |
| 2011/0042730 A1 | 2/2011 | Tajiri et al. |
| 2011/0057263 A1 | 3/2011 | Tang et al. |
| 2011/0260242 A1 | 10/2011 | Jang et al. |
| 2012/0074500 A1 | 3/2012 | Smith |
| 2012/0091526 A1 | 4/2012 | Tang et al. |
| 2012/0139052 A1 | 6/2012 | Tajiri et al. |
| 2012/0217554 A1 | 8/2012 | Lee |
| 2012/0280246 A1 | 11/2012 | Cheah et al. |
| 2013/0171782 A1 | 7/2013 | Minami |
| 2013/0230951 A1 | 9/2013 | Xu et al. |
| 2013/0264632 A1 | 10/2013 | Ding et al. |
| 2013/0271208 A1 | 10/2013 | Then et al. |
| 2013/0316524 A1 | 11/2013 | Jang |
| 2013/0344667 A1 | 12/2013 | Qin et al. |
| 2014/0027853 A1 | 1/2014 | Asenov |
| 2014/0027854 A1 | 1/2014 | Asenov |
| 2014/0042527 A1 | 2/2014 | Lee et al. |
| 2015/0171168 A1* | 6/2015 | Ishida .................. H01L 29/0603 |
| | | 257/324 |
| 2015/0287797 A1 | 10/2015 | Yu et al. |
| 2016/0043193 A1 | 2/2016 | Yu et al. |
| 2016/0133738 A1 | 5/2016 | Chang et al. |
| 2016/0293492 A1 | 10/2016 | Fan et al. |
| 2016/0293493 A1 | 10/2016 | Fan et al. |
| 2016/0336417 A1* | 11/2016 | Hsiao .................. H01L 29/42368 |
| 2016/0351709 A1 | 12/2016 | Nishikawa et al. |
| 2016/0365351 A1 | 12/2016 | Nishikawa et al. |
| 2018/0019262 A1* | 1/2018 | Oh .................. H01L 27/124 |

OTHER PUBLICATIONS

Tu, S.L. et al., "High Breakdown P-Channel InSb MOSFET," Japanese Journal of Applied Physics, vol. 29, No. 3, Part 2, pp. L 398-L 400, (1990).

Yin, Y. et al., "Surface properties of silicon oxide films deposited using low-pressure dielectric barrier discharge," Applied Surface Science vol. 255, pp. 7708-7712, (2009).

Viana, C. E. et al.,"Analysis of SiO2 Thin Films Deposited by PECVD Using an Oxygen-TEOS-Argon Mixture," Brazilian Journal of Physics, vol. 31, No. 2, pp. 299-303, (2001).

Dobkin, D., "Fixed Charge in Deposited Oxides Selected Shorts," Enigmatics, What in the World is Enigmatics?, 12 pages, viewed on Nov. 3, 2016, http://www.enigmaticconsulting.com/semiconductor_processing/selected_shorts/Change_in_dep_oxides.html.

Hamelmann, F. et al., "Deposition of Silicon Oxide Thin Films in Teos With Addition of Oxygen to the Plasma Ambient: IR Spectra Analysis," Journal of Optoelectronics and Advanced Materials vol. 7, No. 1, pp. 389-392, (2005).

* cited by examiner

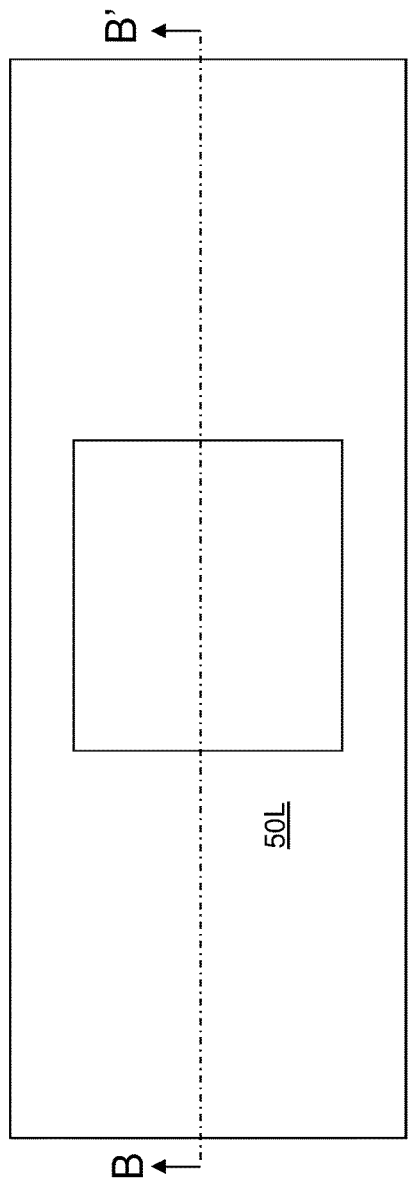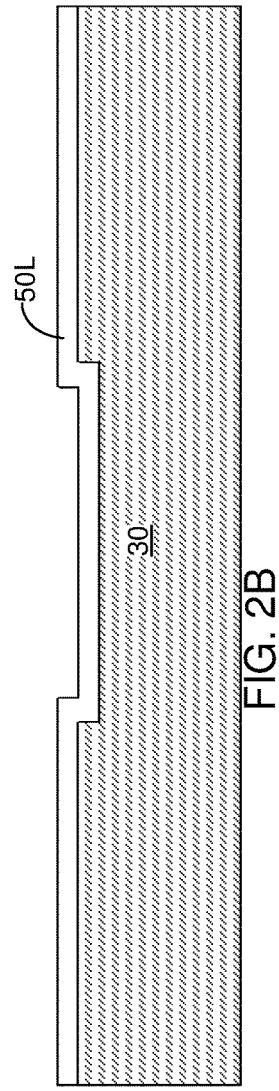

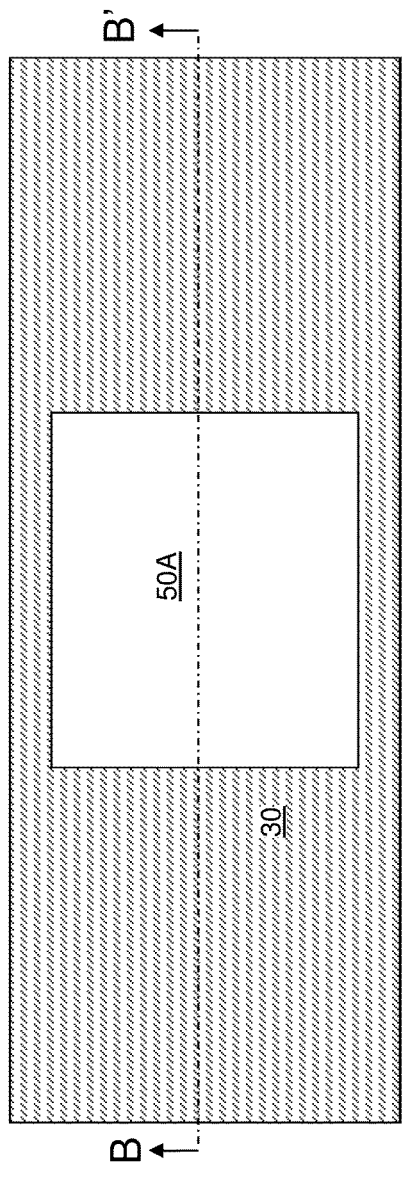
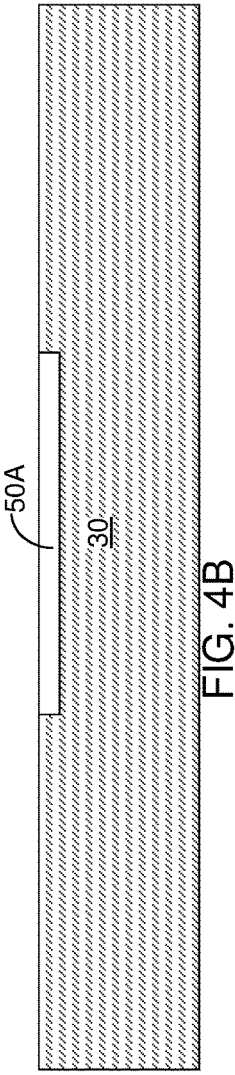
FIG. 4A
FIG. 4B

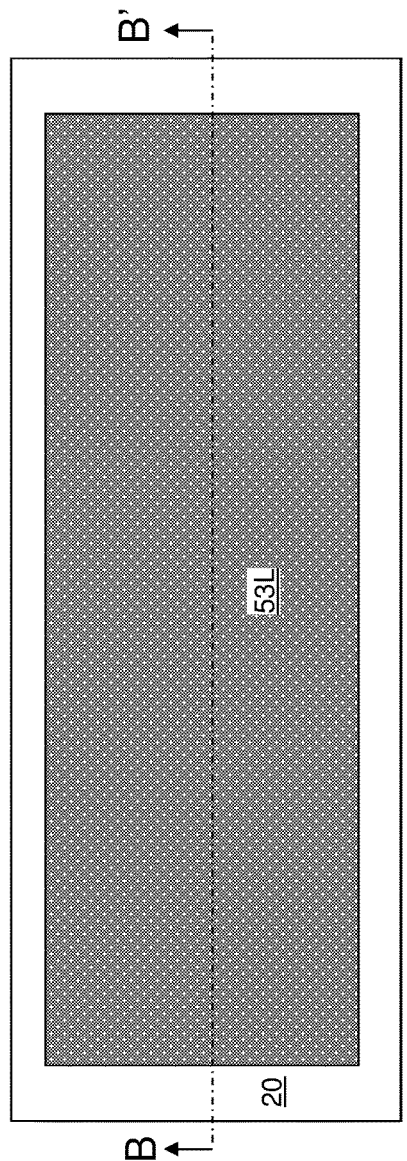
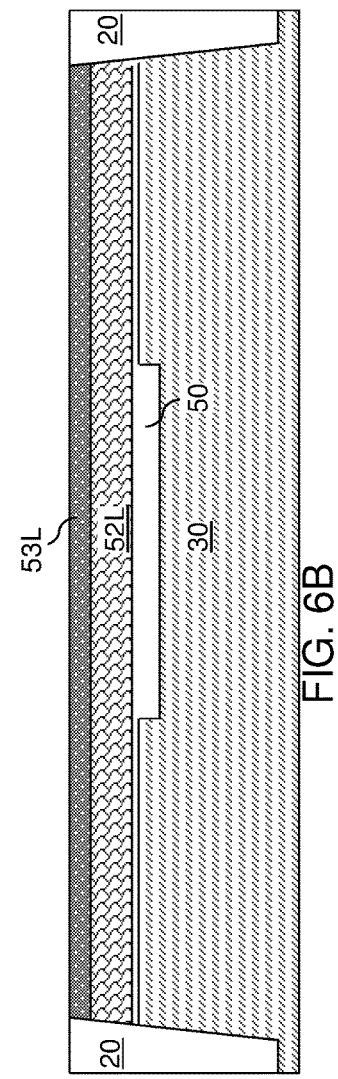

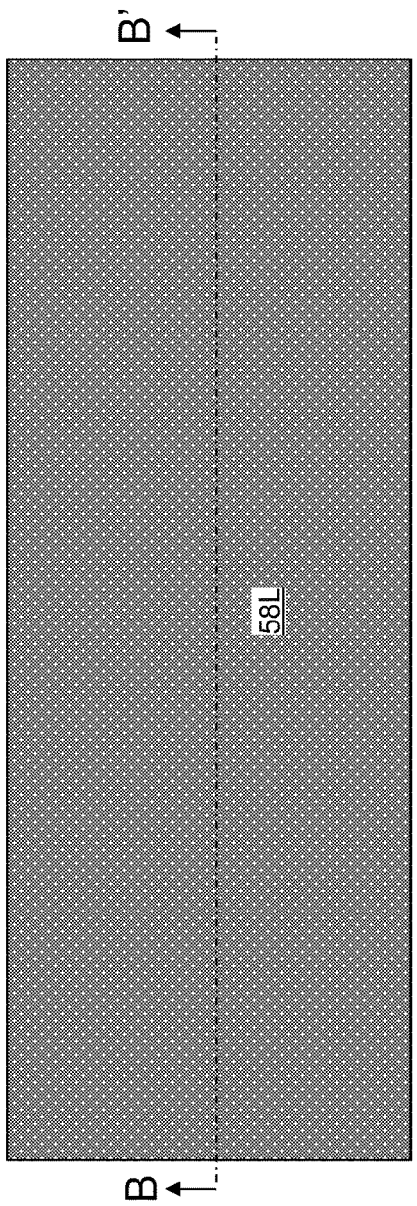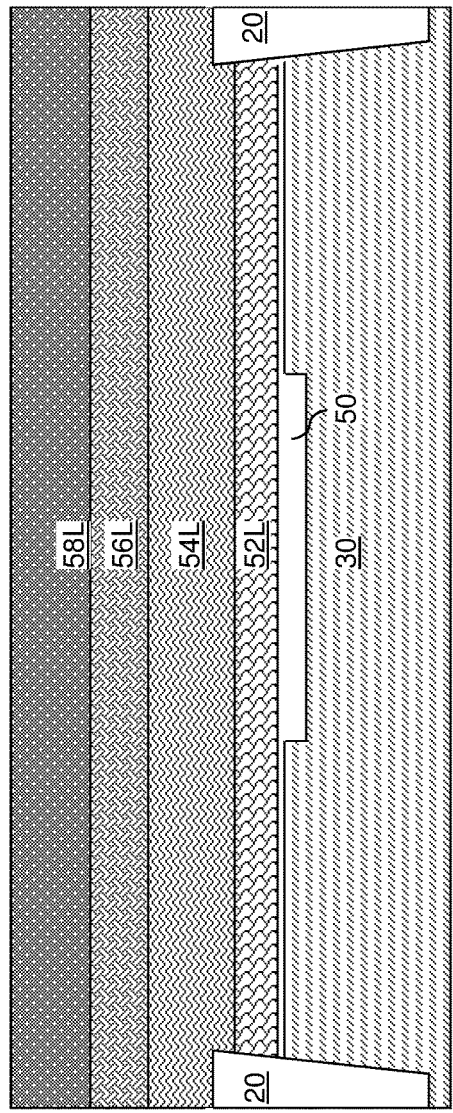
FIG. 7A
FIG. 7B

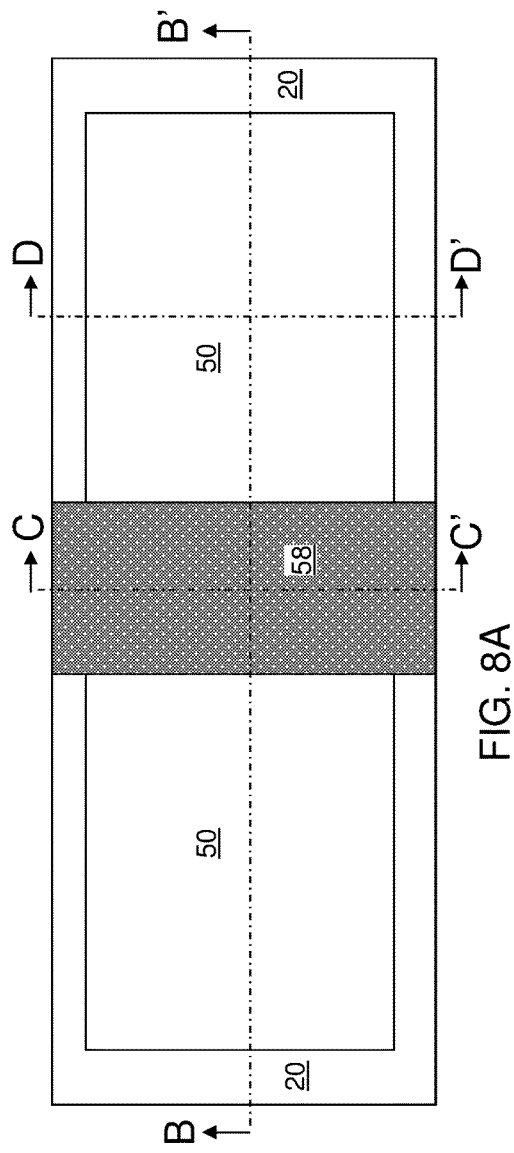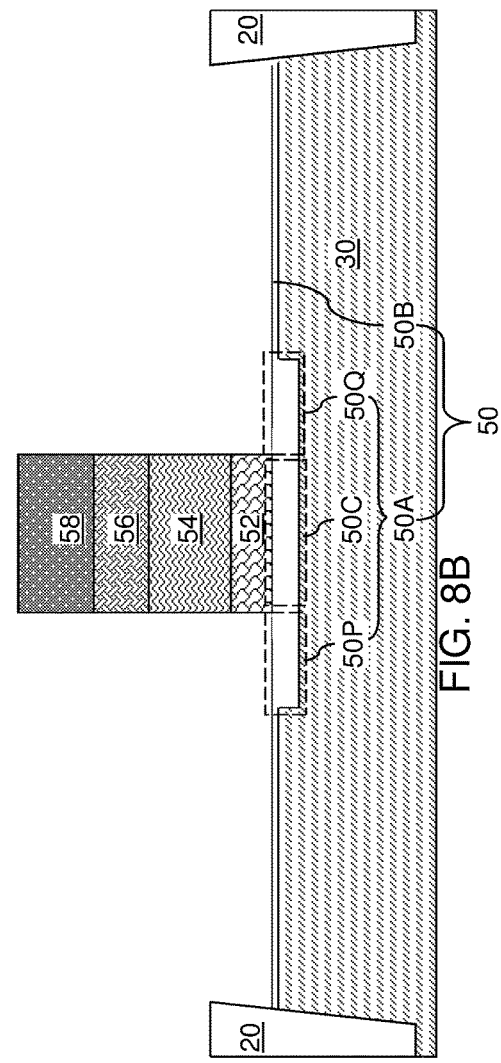
FIG. 8A
FIG. 8B

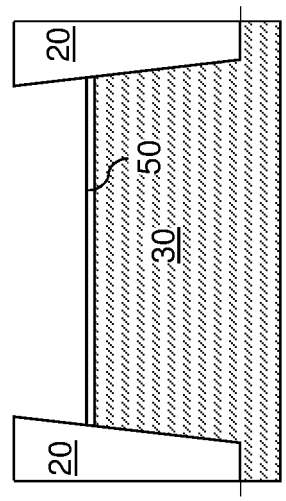
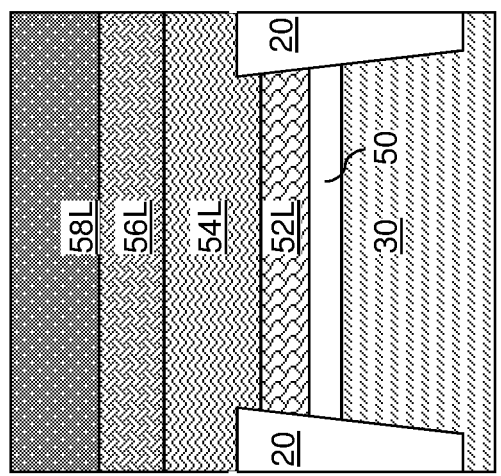

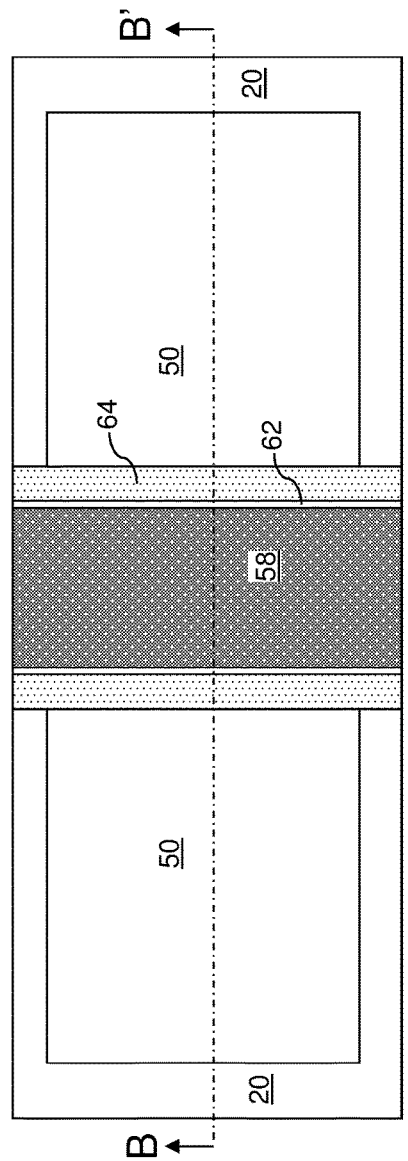
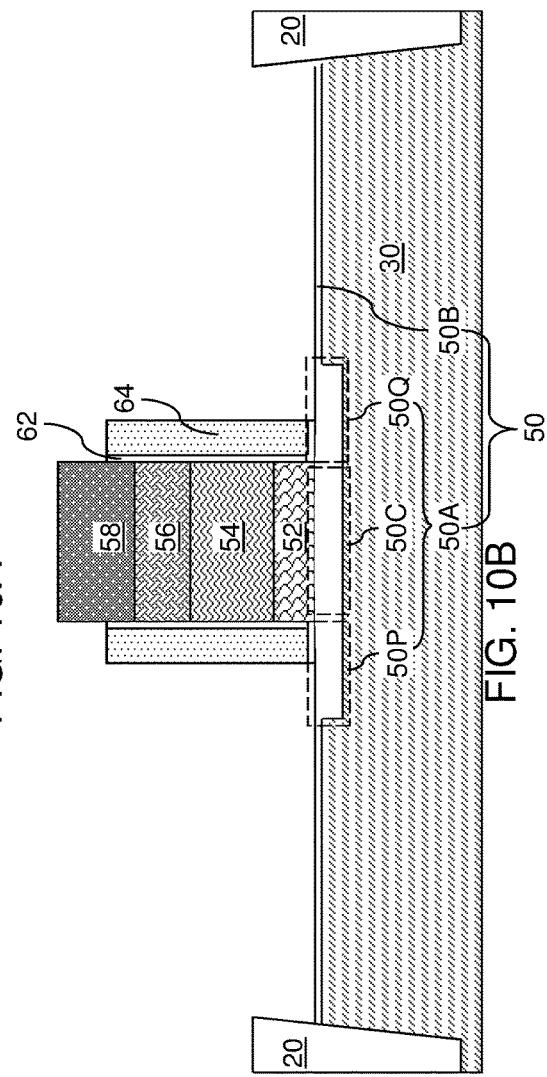
FIG. 10A
FIG. 10B

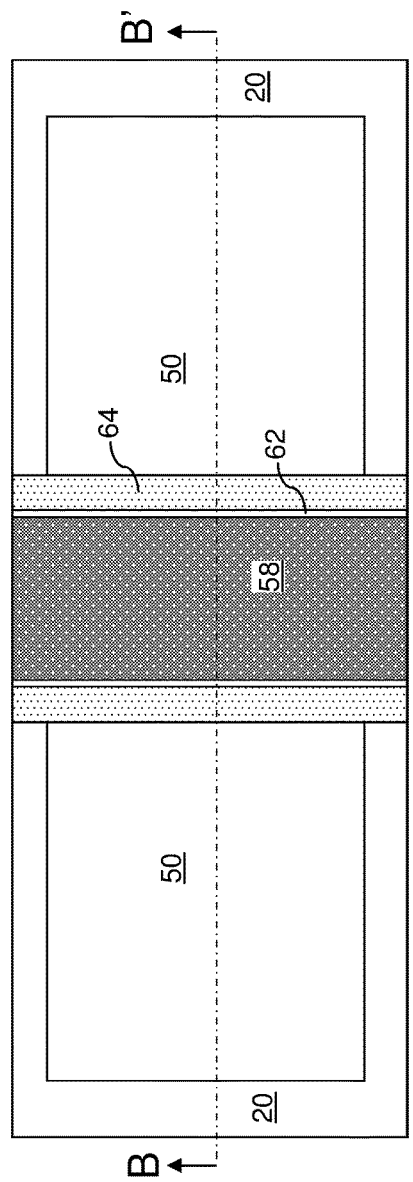
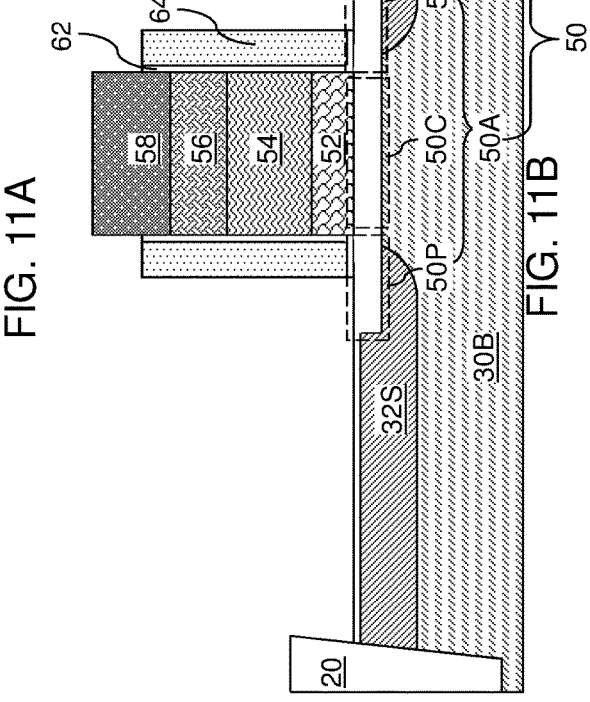
FIG. 11A
FIG. 11B

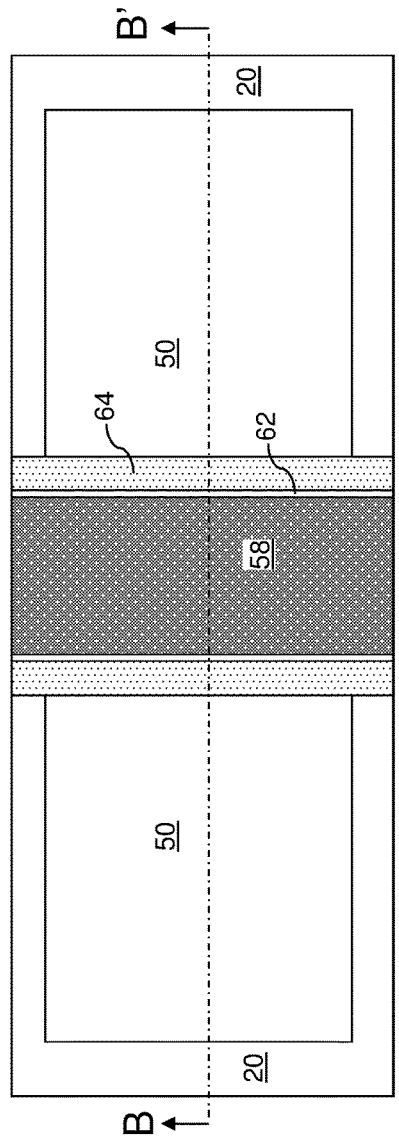
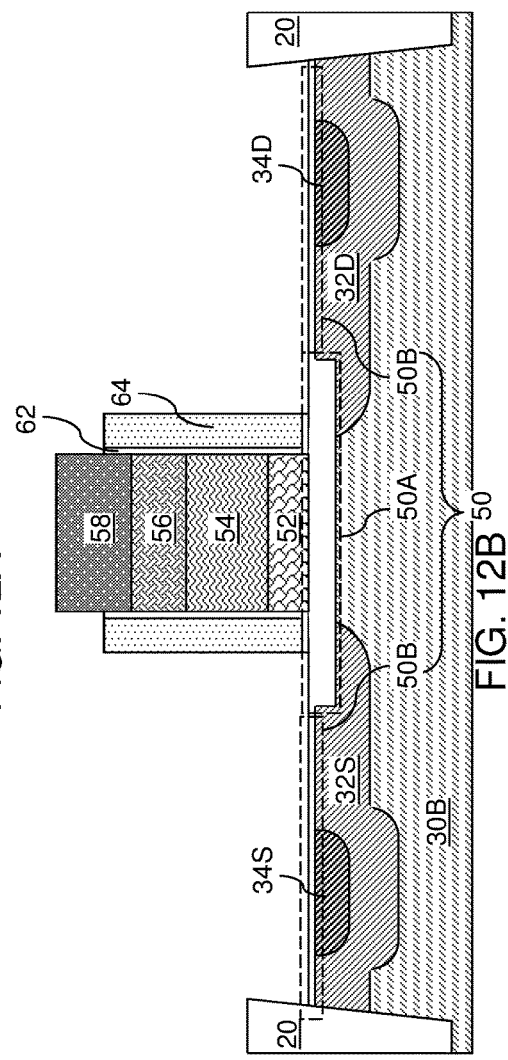
FIG. 12A
FIG. 12B

HIGH VOLTAGE FIELD EFFECT TRANSISTOR WITH LATERALLY EXTENDED GATE DIELECTRIC AND METHOD OF MAKING THEREOF

FIELD

The present disclosure relates generally to the field of semiconductor devices and specifically to a high voltage field effect transistor including a laterally extended gate dielectric and methods of making the same.

BACKGROUND

Prior art high voltage field effect transistors often suffer from surface breakdown voltage. Such transistors often have a complex extended low doped drain (LDD) structure or shallow trench isolation to improve surface breakdown characteristics, at the expense of process complexity and increased cost.

SUMMARY

According to an aspect of the present disclosure, a field effect transistor comprises: a trench located in an upper portion of a semiconductor substrate and having a uniform depth within a periphery thereof, a continuous dielectric material layer including a gate dielectric that fills an entire volume of the trench, a gate electrode overlying a center portion of the gate dielectric, wherein a first peripheral portion and a second peripheral portion of the gate dielectric are located on opposing sides of the center portion of the gate dielectric, and do not have an areal overlap with the gate electrode, a source extension region located within the semiconductor substrate and contacting a first vertical sidewall of the first peripheral portion of the gate dielectric, and a drain extension region located within the semiconductor substrate and contacting a second vertical sidewall of the second peripheral portion of the gate dielectric.

According to another aspect of the present disclosure, a method of forming a field effect transistor is provided. A trench is formed in an upper portion of a semiconductor substrate. A continuous dielectric material layer is formed over the semiconductor substrate, wherein the continuous dielectric material layer includes a gate dielectric that fills an entire volume of the trench. A gate electrode is formed over a center portion of the gate dielectric, wherein a first peripheral portion and a second peripheral portion of the gate dielectric located on opposing sides of the center portion of the gate dielectric are not covered by the gate electrode. A source extension region and a drain extension region are formed within the semiconductor substrate by doping respective portions of the semiconductor substrate. The source extension region is formed through and directly under the first peripheral portion of the gate dielectric, and the drain extension region is formed through directly under the second peripheral portion of the gate dielectric.

According to another aspect of the present disclosure, a field effect transistor, comprises a trench located in an upper portion of a semiconductor substrate, a gate dielectric that fills an entire volume of the trench, a gate electrode overlying the gate dielectric, a source region, and a drain region. The trench has a uniform depth and the gate dielectric has a uniform thickness throughout.

BRIEF DESCRIPTION OF THE DRAWINGS

FIG. 2A is a top-down view of an exemplary structure after deposition of a dielectric material to form a homogenous dielectric material layer according to an embodiment of the present disclosure.

FIG. 2B is a vertical cross-sectional view of the exemplary structure of FIG. 2A along the vertical plane B-B'.

FIG. 4A is a top-down view of the exemplary structure after removal of portions of the dielectric material from outside the trench according to an embodiment of the present disclosure.

FIG. 4B is a vertical cross-sectional view of the exemplary structure of FIG. 4A along the vertical plane B-B'.

FIG. 6A is a top-down view of the exemplary structure after formation of a first doped semiconductor layer, a planarization stopping layer, and a shallow trench isolation structure according to an embodiment of the present disclosure.

FIG. 6B is a vertical cross-sectional view of the exemplary structure of FIG. 6A along the vertical plane B-B'.

FIG. 7A is a top-down view of the exemplary structure after formation of a second doped semiconductor layer, a metallic gate material layer, and a dielectric cap layer according to an embodiment of the present disclosure.

FIG. 7B is a vertical cross-sectional view of the exemplary structure of FIG. 7A along the vertical plane B-B'.

FIG. 8A is a top-down view of the exemplary structure after forming a gate stack according to an embodiment of the present disclosure.

FIG. 8B is a vertical cross-sectional view of the exemplary structure of FIG. 8A along the vertical plane B-B'.

FIG. 8C is a vertical cross-sectional view of the exemplary structure of FIG. 8A along the vertical plane C-C'.

FIG. 8D is a vertical cross-sectional view of the exemplary structure of FIG. 8A along the vertical plane D-D'.

FIG. 10A is a top-down view of the exemplary structure after formation of a dielectric gate liner and a dielectric gate spacer according to an embodiment of the present disclosure.

FIG. 10B is a vertical cross-sectional view of the exemplary structure of FIG. 10A along the vertical plane B-B'.

FIG. 11A is a top-down view of the exemplary structure after formation of a source extension region and a drain extension region according to an embodiment of the present disclosure.

FIG. 11B is a vertical cross-sectional view of the exemplary structure of FIG. 11A along the vertical plane B-B'.

FIG. 12A is a top-down view of the exemplary structure after formation of a source region and a drain region according to an embodiment of the present disclosure.

FIG. 12B is a vertical cross-sectional view of the exemplary structure of FIG. 12A along the vertical plane B-B'.

DETAILED DESCRIPTION

Figure 1A:
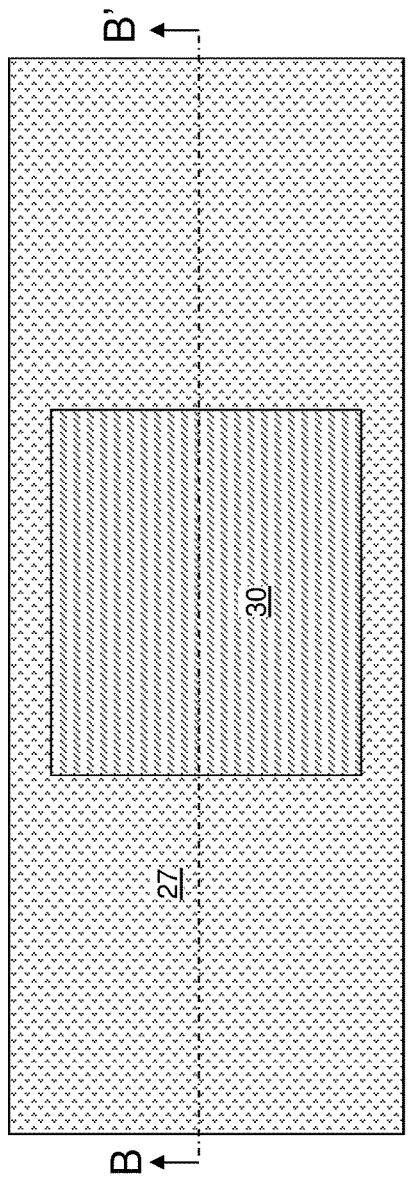
FIG. 1A is a top-down view of an exemplary structure after formation of a trench in an upper portion of a substrate according to an embodiment of the present disclosure.

The present inventors realized that bottom corners of a gate dielectric of a high voltage field effect transistor are subjected to a high electrical field during operation. Dielectric breakdown can occur at bottom corners of the gate dielectric during high voltage operation of the field effect transistor. Embodiments of the present disclosure provide a high voltage field effect transistor including a laterally extended gate dielectric and methods of making the same, the various aspects of which are described below. The field effect transistor can have a higher resistance to high voltage breakdown and can be scaled to a smaller size.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material", "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "field effect transistor" refers to any semiconductor device having a semiconductor channel through which electrical current flows with a current density modulated by an external electrical field. As used herein, a "channel region" refers to a semiconductor region in which mobility of charge carriers is affected by an applied electrical field. A "gate electrode" refers to a conductive material portion that controls electron mobility in the channel region by application of an electrical field. A "source region" refers to a doped semiconductor region that supplies charge carriers that flow through the channel region. A "drain region" refers to a doped semiconductor region that receives charge carriers supplied by the source region and passes through the channel region. An "active region" refers to a source region of a field effect transistor or a drain region of a field effect transistor. A "source extension region" refers to a doped semiconductor region having a lesser dopant concentration than, and having a same type of doping as, a source region and including a portion disposed between the source region and the channel region. A "drain extension region" refers to a doped semiconductor region having a lesser dopant concentration than, and having a same type of doping as, a drain region and including a portion disposed between the drain region and the channel region. An "active region extension" refers to a source extension region or a drain extension region.

Figure 1B:
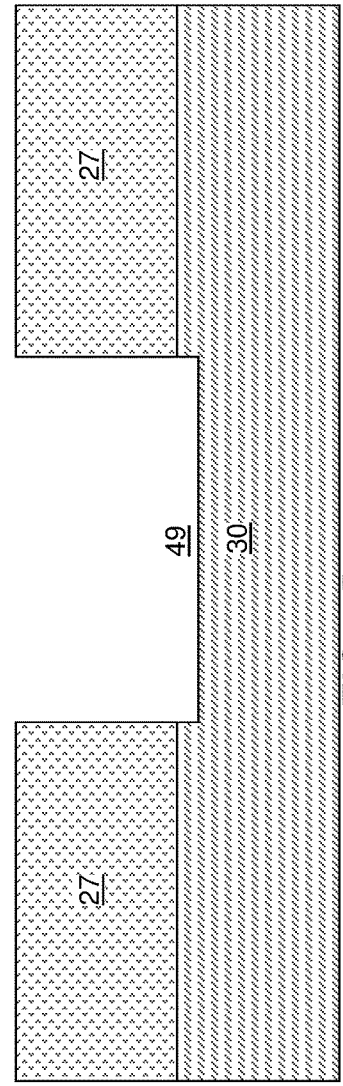
FIG. 1B is a vertical cross-sectional view of the exemplary structure of FIG. 1A along the vertical plane B-B'.

Referring to FIGS. 1A and 1B, an exemplary structure according to an embodiment of the present disclosure is illustrated, which includes a semiconductor substrate 30. As used herein, a "semiconductor substrate" refers to a substrate that includes at least one semiconductor material portion, i.e., at least one portion of a semiconductor material. The semiconductor substrate 30 includes a semiconductor material at least at a top portion thereof. The semiconductor substrate 30 may optionally include at least one additional material layer at a bottom portion thereof. In one embodiment, the semiconductor substrate 30 can be a bulk semiconductor substrate consisting of a semiconductor material (e.g., single crystal silicon wafer), or can be a semiconductor-on-insulator (SOI) substrate including a buried insulator layer (such as a silicon oxide layer) underlying the semiconductor (e.g., silicon) material portion, and a handle substrate underlying the buried insulator layer.

The semiconductor substrate 30 can include a lightly doped semiconductor material portion on which at least one field effect transistor can be formed. In one embodiment, the entirety of the semiconductor material on the semiconductor substrate 30 may include the lightly doped semiconductor material. In another embodiment, the lightly doped semiconductor material can be a semiconductor well embedded within another semiconductor material having a different dopant concentration and optionally, a doping of the opposite conductivity type. The dopant concentration of the lightly doped semiconductor material portion may be optimized for a body region of the at least one field effect transistor to be subsequently formed. For example, the lightly doped semiconductor material portion may include electrical dopants at an atomic concentration in a range from $1.0 \times 10^{14}/cm^3$ to $1.0 \times 10^{18}/cm^3$, such as from $1.0 \times 10^{15}/cm^3$ to $1.0 \times 10^{17}/cm^3$, although lesser and greater atomic concentrations can also be employed. The conductivity type of the portion of the semiconductor substrate 30 to be subsequently employed as a body region of a field effect transistor is herein referred to as a first conductivity type, which may be p-type for an n-type field effect transistor or n-type for a p-type field effect transistor.

The semiconductor material of the semiconductor substrate 30 can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the semiconductor substrate 30 can be in a range from 0.5 mm to 2 mm in case the semiconductor substrate 30 is a bulk semiconductor substrate. In case the semiconductor substrate 30 is a semiconductor-on-insulator substrate, the thickness of the top semiconductor material layer within the semiconductor substrate 30 may be in a range from 100 nm to 1,000 nm, although lesser and greater thicknesses can also be employed.

A photoresist layer 27 can be applied over the top surface of the semiconductor substrate 30, and can be subsequently patterned to form an opening, such as a rectangular opening therein. Two sides of the rectangular opening (herein referred to as "lengthwise sides") may be parallel to the channel direction (i.e., the current flow direction that connects a source region and a drain region of a field effect transistor to be subsequently formed), and two other sides of the rectangular opening (herein referred to as "widthwise sides") may be perpendicular to the channel direction. The lateral dimension of the rectangular opening along the channel direction is herein referred to as the length of the rectangular opening. The length of the rectangular opening may be in a range from 200 nm to 10,000 nm, although lesser and greater lateral dimensions can also be employed. The length of the rectangular opening is selected to be greater than the length of the channel (i.e., the shortest distance between a source extension region and a drain extension region of a field effect transistor to be subsequently formed) by the sum of an overlap distance between a gate dielectric and the source extension region and an overlap distance between the gate dielectric and the drain extension region. For example, the lateral dimension of the rectangular opening along the channel direction can be in a range from 110% to 300% of the length of the channel. Additionally or alternately, the lateral dimension of the rectangular opening along the channel direction can be longer than the length of the channel by a distance in a range from 200 nm to 1,000 nm, although lesser and greater differences can also be employed.

The dimension of the rectangular opening along the widthwise direction, i.e., the direction parallel to the widthwise sides of the rectangular opening and perpendicular to the channel direction, is herein referred to as the width of the rectangular opening. The width of the rectangular opening may be selected according to the on-current requirement of the field effect transistor to be subsequently formed. Generally, the on-current of the field effect transistor is linearly proportional to the width of the rectangular opening.

The photoresist layer 27 can include a mid-ultraviolet (MUV) photoresist material, and may be patterned employing MUV photolithographic methods. An anisotropic etch may be performed to remove a surface portion of the semiconductor substrate 30 within the area of the rectangular opening in the photoresist layer 27. The anisotropic etch chemistry can be selected based on the semiconductor material of the semiconductor substrate 30. In one embodiment, a combination of $CF_4$ and $O_2$ may be employed during the anisotropic etch process. In another embodiment, a combination of HBr, $Cl_2$, and $O_2$ may be employed during the anisotropic etch process. The recess depth can be selected to be on the order of the target thickness of a gate dielectric to be subsequently formed. For example, the recess depth into the semiconductor substrate 30 may be in a range from 20 nm to 80 nm, such as from 30 nm to 60 nm, although lesser and greater recess depths can also be employed. The recess depth can be uniform within the periphery of the rectangular opening in the photoresist layer 27. A trench 49 is formed within the area of the opening in the photoresist layer 27. The trench 49 can have a uniform depth within a periphery defined by the bottom edges of the sidewalls of the trench 49, and may have substantially vertical sidewalls. As used herein, a surface is "substantially vertical" if the surface is vertical or has a taper angle less than 5 degrees with respect to a vertical line. In one embodiment, the sidewalls of the trench 49 can be vertical. In this case, the trench 49 can have the same depth throughout the entire area of the trench 49.

In an alternative embodiment, an isotropic etch may be employed in lieu of the anisotropic etch process. The isotropic etch process may employ a gas phase etchant such as HCl in a dry etch process, or may employ a liquid phase etchant such as a combination of hydrofluoric acid, nitric acid, and acetic acid. In this case, the undercut distance underneath the photoresist layer 27 can be about the same as the depth of the trench 49. The trench 49 can have a uniform depth within a bottom periphery defined by the bottom edges of the sidewalls of the trench 49. The lateral offset between a top periphery defined by the top edges of the sidewalls of the trench 49 and the bottom periphery of the trench 49 is not greater than the depth of the trench 49. The depth of the trench 49 can be within the same range as in the embodiment in which an anisotropic etch is employed.

The isotropic nature of the etch process can generate concave surfaces as the sidewalls of the trench 49. In one embodiment, the entire set of sidewall surfaces of the trench 49 between the horizontal top surface of the semiconductor substrate 30 and the horizontal bottom surface of the trench 49 can consist of concave sidewall surfaces. This feature is different from the geometry of surfaces that can be formed by a local oxidation of silicon (LOCOS) process that generates a bird's beak feature in that such surfaces inherently include a combination of concave surfaces and convex surfaces even after removal of a thermal silicon oxide portion selective silicon by an etchant (such as hydrofluoric acid). Further, in one embodiment, the lateral extent of any sidewall of the trench 49 (i.e., the offset between the upper edge and the lower edge of any sidewall of the trench 49) does not exceed the vertical extent of the same sidewall of the trench (i.e., the depth of the trench 49), which is different from the case of LOCOS oxidation process that produces features in which the lateral dimension of each sidewall exceeds the vertical dimension of the respective sidewall due to extensive thermal diffusion of oxygen and formation of bird's beak in the thermal silicon oxide portion that is formed. The patterned photoresist layer 27 can be subsequently removed, for example, by ashing.

Referring to FIGS. 2A and 2B, a dielectric material layer 50L can be formed over the semiconductor substrate 30. The dielectric material layer 50L may be a silicon-oxide containing dielectric material (e.g., silicon dioxide) or a metal oxide (e.g., aluminum oxide, tantalum oxide, hafnium oxide, etc.) dielectric material. The silicon-oxide containing dielectric material may be homogeneous, and can be formed by conversion of the surface portion of the semiconductor substrate 30 and/or by deposition. In one embodiment, the homogeneous dielectric material layer 50L can be formed by conversion of the surface portion of the semiconductor substrate 30 to a semiconductor oxide material (e.g., by wet or dry thermal oxidation of a silicon substrate surface to silicon oxide). In one embodiment, the homogeneous dielectric material layer 50L can comprise, or consist essentially of, thermally grown silicon oxide. In another embodiment, the homogeneous dielectric material layer 50L can be formed by deposition of a silicon-oxide containing dielectric material or a metal oxide dielectric material. For example, the silicon-oxide containing dielectric material can be deposited by atomic layer deposition, chemical vapor deposition such as low pressure chemical vapor deposition (LP-CVD), or plasma enhanced chemical vapor deposition (PECVD). The silicon-oxide containing dielectric material can be deposited employing tetraethylorthosilicate (TEOS) as a precursor or employing dichlorosilane ($SiCl_2H_2$) and nitrous oxide ($N_2O$) as reactants. The silicon-oxide containing dielectric material includes silicon oxide can include at least one element other than silicon and oxygen at an atomic concentration greater than 1 part per million. In one embodiment, the silicon-oxide containing dielectric material may be formed employing a carbon-containing precursor, and the silicon-oxide containing dielectric material includes silicon oxide having an impurity carbon concentration of at least $1.0 \times 10^{18}/cm^3$. For example, if TEOS is employed as a precursor, the silicon oxide materials can include residual carbon at an atomic concentration greater than $1.0 \times 10^{18}/cm^3$. For example, the atomic concentration of carbon may in a range from than $1.0 \times 10^{19}/cm^3$ to $2.0 \times 10^{20}/cm^3$. Alternatively, if the silicon-oxide containing dielectric material is deposited by plasma enhanced chemical vapor deposition (PECVD) employing dichlorosilane and oxygen as reactants. In this case, the deposited silicon-oxide containing material can include hydrogen atoms at an atomic concentration greater than 1 part per million and/or chlorine atoms at an atomic concentration greater than 1 part per million.

The dielectric material is deposited in the trench 49 and over the top surface of the semiconductor substrate 30 outside of the trench 49. The homogeneous dielectric material layer 50L may be conformal or non-conformal. The thickness of the homogeneous dielectric material layer 50L can be the same above the topmost surface of the semiconductor substrate 30 and inside the trench 49. The thicknesses of the homogeneous dielectric material layer 50L can be in a range from 100% to 150% of the depth of the trench 49, and can be in a range from 20 nm to 120 nm, although lesser and greater thicknesses can also be employed. In one embodiment, the top surface of the homogeneous dielectric material layer 50L over the trench 49 can be located at, or above, the horizontal plane including the top surface of the semiconductor substrate 30. The homogeneous dielectric material layer 50L can have a uniform thickness in the trench 49 and outside the trench 49. The homogeneous dielectric material layer 50L can fill the entire volume of the trench 49.

Figure 3A:
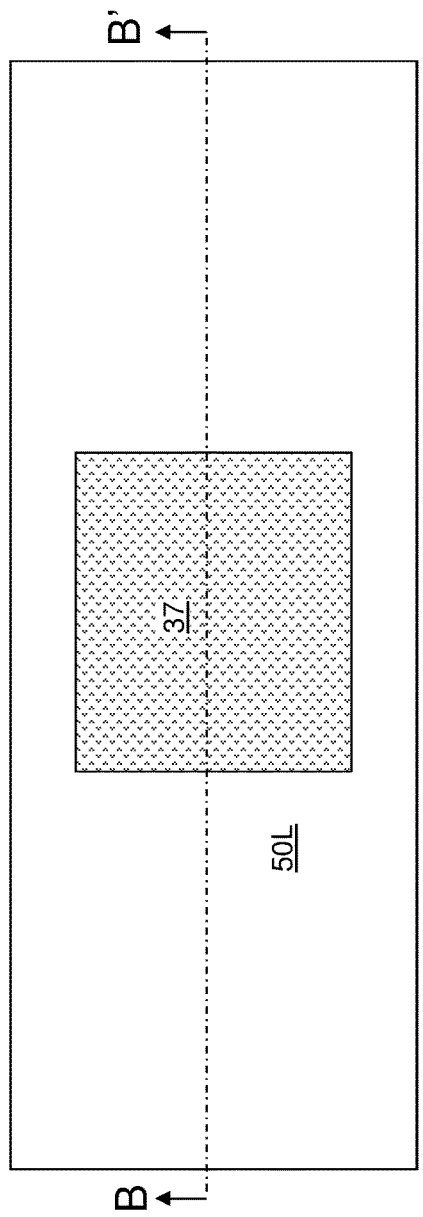
FIG. 3A is a top-down view of the exemplary structure after formation of an optional self-aligned patterned mask layer according to an embodiment of the present disclosure.
Figure 3B:
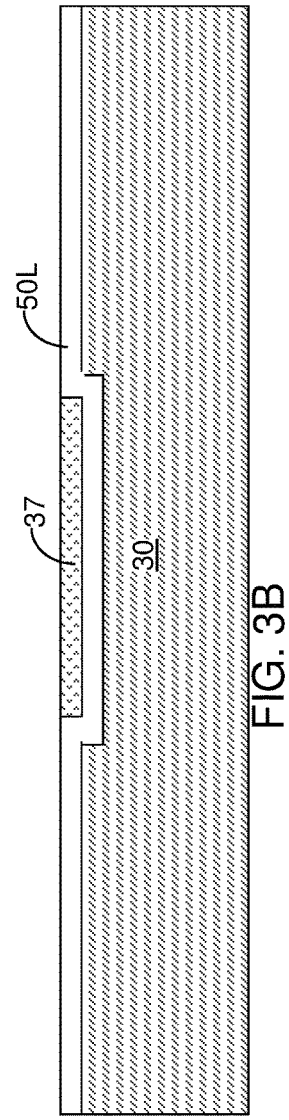
FIG. 3B is a vertical cross-sectional view of the exemplary structure of FIG. 3A along the vertical plane B-B'.

Referring to FIGS. 3A and 3B, an optional self-aligned patterned mask layer 37 can be formed in a recessed region of the homogeneous dielectric material layer 50L that is located within the area of the trench 49. The self-aligned patterned mask layer 37 includes a mask material that covers only the recessed region of the homogeneous dielectric material layer 50L, while not covering the portion of the topmost surface of the homogeneous dielectric material layer 50L. The mask material can include a self-planarizing material or a planarizable material can be deposited and subsequently planarized. The mask material of the self-aligned patterned mask layer 37 can include, for example, a photoresist material, an organic polymer, a silicon-based polymer, amorphous carbon, diamond-like carbon (DLC), or an amorphous or polycrystalline semiconductor material (such as polysilicon). Excess portions of the mask material can be removed by a planarization process such as a recess etch (in case the mask material is self-planarizing) or chemical mechanical planarization.

Referring to FIGS. 4A and 4B, portions of the dielectric material of the homogeneous dielectric material layer 50L can be removed from outside the trench 49. Specifically, if the optional patterned mask layer 37 is present, then physically exposed portions of the dielectric material of the homogeneous dielectric material layer 50L that are not covered by the self-aligned patterned mask layer 37 can be removed by an etch process, which may be an anisotropic etch process or an isotropic etch process. The self-aligned patterned mask layer 37 can be a mask layer during the etch process. In one embodiment, a wet etch employing dilute hydrofluoric acid can be employed. In another embodiment, a dry etch employing an etch chemistry employing $CF_4/O_2$, $CF_4/CHF_3/Ar$, $C_2F_6$, $C_3F_8$, $C_4F_8/CO$, $C_5F_8$, or $CH_2F_2$ can be employed. Removal of the physically exposed portion of the homogeneous dielectric material layer 50L from areas not covered by the self-aligned patterned mask layer 37 can physically expose the topmost surface of the semiconductor substrate 30. Alternatively, if the patterned mask layer 37 is not used, then the removal of portions of the homogeneous dielectric material layer 50L located above the top surface of the substrate 30 outside the trench 49 can be performed by chemical mechanical planarization (CMP). The remaining portion of the homogeneous dielectric material layer 50L is subsequently employed as a gate dielectric material of a field effect transistor to be subsequently formed, and thus, is herein referred to as a gate dielectric 50A. At this processing step, the gate dielectric 50A can have a uniform thickness and a homogeneous composition throughout.

Figure 5A:
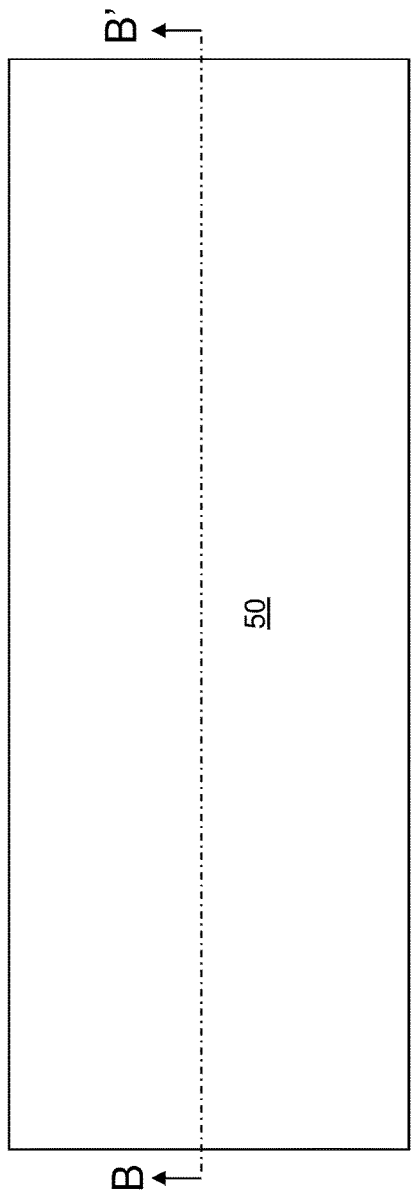
FIG. 5A is a top-down view of the exemplary structure after conversion of a surface portion of the semiconductor substrate outside of the trench into a semiconductor oxide layer according to an embodiment of the present disclosure.
Figure 5B:
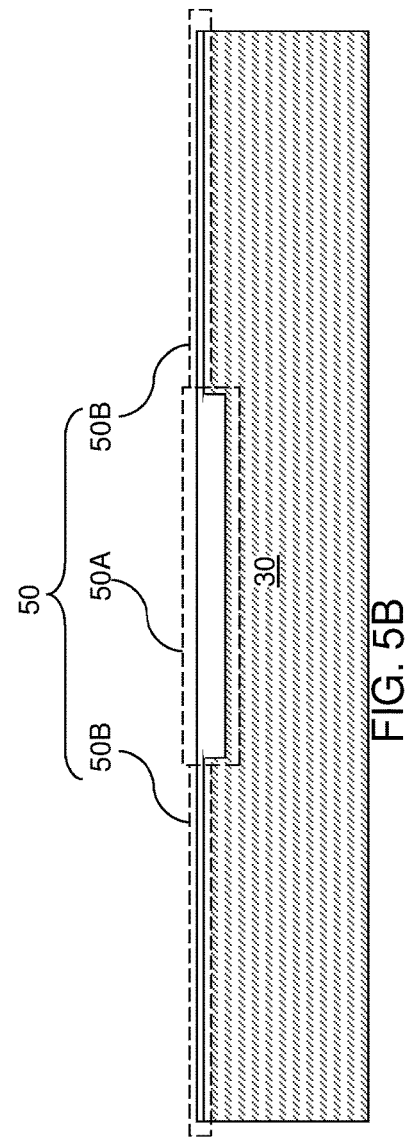
FIG. 5B is a vertical cross-sectional view of the exemplary structure of FIG. 5A along the vertical plane B-B'.

Referring to FIGS. 5A and 5B, a thermal oxidation process may be optionally performed to convert a physically exposed surface portion of the semiconductor substrate 30 outside of the trench into a semiconductor oxide layer 50B. The semiconductor oxide layer 50B may be employed as a portion of a gate dielectric for additional low voltage field effect transistors to be subsequently formed in another device region (not shown). For example, the semiconductor oxide layer 50B can include thermal silicon oxide having a thickness in a range from 1 nm to 10 nm (such as from 2 nm to 6 nm), although lesser and greater thicknesses can also be employed. If formation of additional low voltage field effect transistors is not necessary, the thermal oxidation process may be omitted.

If the thermal oxidation process is performed, the thickness of the gate dielectric 50A may collaterally increase due to diffusion of oxygen atoms through the gate dielectric 50A during the oxidation process and conversion of a surface portion of the semiconductor substrate 30 directly underneath the gate dielectric 50A into a silicon oxide material layer that is incorporated into the gate dielectric 50A. In this case, a bottommost portion of the gate dielectric 50A can include thermal silicon oxide that consists essentially of silicon oxide, while an upper portion of the gate dielectric 50A has the composition of the dielectric material deposited during formation of the homogeneous dielectric material layer 50L, and thus, may include at least one element other than silicon and oxygen (such as carbon, hydrogen, and/or chlorine) at an atomic concentration greater than 1 part per million. In this case, the gate dielectric 50A may have a vertical compositional gradient in the concentration of the at least one element other than silicon and oxygen.

The gate dielectric 50A and the semiconductor oxide layer 50B can be formed as an integral structure, i.e., a single continuous material portion, and are collectively referred to as a continuous dielectric material layer 50. The semiconductor oxide layer 50B of the continuous dielectric material layer 50 is adjoined to peripheries of the gate dielectric 50A upon formation of the semiconductor oxide layer 50B. The continuous dielectric material layer 50 includes the gate dielectric 50A that fills the entire volume of the trench 49 and having a first uniform thickness throughout, and the semiconductor oxide layer 50B overlying the topmost horizontal surface of the semiconductor substrate 30 and having a second uniform thickness (that is less than the first uniform thickness) throughout.

Referring to FIGS. 6A and 6B, a conductive gate electrode material layer and a planarization stopping layer 53L can be sequentially formed. For example, a first doped semiconductor layer 52L and a planarization stopping layer 53L can be sequentially deposited over the continuous dielectric material layer 50. The first doped semiconductor material layer 52L includes a doped semiconductor material such as doped polysilicon, and can be deposited by chemical vapor deposition (CVD) such as low pressure chemical vapor deposition (LPCVD) or plasma enhanced chemical vapor deposition (PECVD). In one embodiment, the first doped semiconductor material layer 52L can include doped polysilicon including p-type dopants or n-type dopants at an atomic concentration in a range from $1.0 \times 10^{19}/cm^3$ to $1.0 \times 10^{21}/cm^3$, although lesser and greater atomic concentrations can also be employed. The thickness of the first doped semiconductor material layer 52L can be in a range from 20 nm to 200 nm, although lesser thicknesses can also be employed.

The planarization stopping layer 53L includes a material that can be removed selective to the material of the first doped semiconductor layer 52L and can function as a stopping layer during a planarization process. For example, the planarization stopping layer 53L can include silicon nitride. The thickness of the planarization stopping layer 53L can be in a range from 5 nm to 50 nm, although lesser and greater thicknesses can also be employed.

A shallow trench can be formed, which vertically extends through the planarization stopping layer 53L and the first doped semiconductor layer 52L and into an upper portion of the semiconductor substrate 30. The shallow trench laterally surrounds a portion of the continuous dielectric material layer 50 in an upper portion of the semiconductor substrate 30, and is herein referred to as a moat trench. For example, a photoresist layer (not shown) can be applied over the planarization stopping layer 53L and can be lithographically patterned to form an opening that laterally surrounds an area in which a field effect transistor is to be subsequently formed. Thus, a patterned portion of the photoresist layer can overlie a portion of the exemplary structure within the area of the field effect transistor to be formed. An anisotropic etch can be performed to etch portions of the planarization stopping layer 53L, the first doped semiconductor layer 52L, and an upper portion of the semiconductor substrate 30 that underlie the opening in the photoresist layer. The moat trench is formed underneath the opening in the photoresist layer. The moat trench laterally surrounds a stack including a patterned portion of the planarization stopping layer 53L, a patterned portion of the first doped semiconductor layer 52L, a patterned portion of the continuous dielectric material layer 50, and a patterned upper portion of the semiconductor substrate 30. In one embodiment, the moat trench can include tapered sidewalls. The depth of the moat trench can be selected such that the bottom surface of the moat trench has a greater depth than the bottom surface of source and drain extension regions to be subsequently formed. The photoresist layer can be removed, for example, by ashing.

A dielectric fill material such as silicon oxide can be deposited in the moat trench. Optionally, a reflow process may be performed to induce reflow of the deposited dielectric fill material. Optionally, a dielectric liner such as a silicon nitride liner may be employed before depositing the dielectric fill material. The dielectric fill material can include doped silicate glass or undoped silicate glass. Excess portions of the deposited dielectric fill material can be removed from above the top surface of the planarization stopping layer 53L by a planarization process, which may employ chemical mechanical planarization and/or a recess etch. A remaining portion of the dielectric fill material that fills the moat trench constitutes a shallow trench isolation structure 20. In one embodiment, the top surface of the shallow trench isolation structure 20 may be coplanar with the top surface of the planarization stopping layer 53L. In another embodiment, the top surface of the shallow trench isolation structure 20 may be recessed with respect to the horizontal plane including the top surface of the planarization stopping layer 53L. In one embodiment, the recessed surface of the shallow trench isolation structure 20 may be at, or about, the level of the top surface of the semiconductor substrate 30. Alternatively, the top surface of the shallow trench isolation structure 20 can be at, or about, the level of the planarization stopping layer 53L or the first doped semiconductor layer 52L.

Referring to FIGS. 7A and 7B, the planarization stopping layer 53L can be removed selective to the first doped semiconductor layer 52L. If the planarization stopping layer 53L includes silicon nitride, a wet etch employing hot phosphoric acid can be performed to remove the planarization stopping layer 53L selective to the first doped semiconductor layer 52L and the shallow trench isolation structure 20.

Subsequently, optional additional gate electrode layers (54L, 56L) can be sequentially formed. The optional additional gate electrode layers (54L, 56L) can include, for example, a second doped semiconductor layer 54L and a metallic gate material layer 56L. Each of the additional gate electrode layers (54L, 56L) can be formed by chemical vapor deposition (CVD). In an illustrative example, the second doped semiconductor layer 54L can include a heavily doped semiconductor material having a doping of the same conductivity type as the first doped semiconductor layer 54L. The thickness of the second doped semiconductor layer 54L can be in a range from 50 nm to 200 nm, although lesser and greater thicknesses can also be employed. The metallic gate material layer 56L can include a metal-semiconductor alloy material such as a metal silicide. For example, the metallic gate material layer 56L can be formed by deposition of a metal or an intermetallic alloy (such as W, Co, Ni, Ti, and/or Pt) that reacts with silicon or germanium, and by inducing reaction of the deposited metal or intermetallic alloy with the underlying semiconductor material of the second doped semiconductor layer 54L. The thickness of the metallic gate material layer 56L can be in a range from 10 nm to 100 nm, although lesser and greater thicknesses can also be employed.

A dielectric cap layer 58L can be subsequently formed. The dielectric cap layer 58L includes a dielectric material that can function as a diffusion barrier for metallic impurities and non-metallic impurities (such as fluorine, hydrogen, and/or oxygen). In one embodiment, the dielectric cap layer 58L can include silicon nitride. The dielectric cap layer 58L can be deposited, for example, by chemical vapor deposition. The thickness of the dielectric cap layer 58L can be in a range from 10 nm to 150 nm, although lesser and greater thicknesses can also be employed. The layer stack including the first doped semiconductor layer 52L, the second doped semiconductor layer 54L, the metallic gate material layer 56L, and the dielectric cap layer 58L is herein referred to as a gate layer stack (52L, 54L, 56L, 58L).

Referring to FIGS. 8A-8D, a photoresist layer can be applied over the gate layer stack (52L, 54L, 56L, 58L), and can be patterned by lithographic exposure and development. The pattern of the photoresist layer includes a shape that straddles the area that is laterally enclosed by the shallow trench isolation structure 20. The shape of the area that is laterally enclosed by the shallow trench isolation structure 20 can be rectangular. The shape of the pattern that straddles the area laterally enclosed by the shallow trench isolation structure 20 can be rectangular, and can have a pair of edges that are perpendicular to the channel direction (i.e., the direction of charge carriers in the body region of the field effect transistor to be subsequently formed).

The pattern in the photoresist layer can be transferred through the gate layer stack (52L, 54L, 56L, 58L) by a series of anisotropic etch processes. The anisotropic etch process that etches the first doped semiconductor layer 52L can be selective to the material of the continuous dielectric material layer 50. For example, if the first doped semiconductor layer 52L includes doped polysilicon, a reactive ion etch process employing combination of $CF_4$ and $O_2$ or a combination of $HBr$, $Cl_2$, and $O_2$ may be employed to anisotropically etch the first doped semiconductor layer 52L selective to the silicon oxide material of the continuous dielectric material layer 50.

The remaining portion of the dielectric cap layer 58L straddling the gate dielectric 50A is herein referred to as a gate cap dielectric 58. The remaining portion of the metallic gate material layer 56L straddling the gate dielectric 50A is herein referred to as a metallic gate electrode portion 56. The remaining portion of the second doped semiconductor layer 54L straddling the gate dielectric 50A is herein referred to as a second semiconductor gate electrode portion 54. The remaining portion of the first doped semiconductor layer 52L straddling the gate dielectric 50A is herein referred to as a first semiconductor gate electrode portion 52. The set of the first semiconductor gate electrode portion 52, the second semiconductor gate electrode portion 54, and the metallic gate electrode portion 56 constitutes a gate electrode (52, 54, 56) of a field effect transistor. The gate cap dielectric 58 is located on top of the gate electrode (52, 54, 56). The gate electrode (52, 54, 56) is formed over a center portion 50C of the gate dielectric 50A. The center portion 50C of the gate dielectric 50A is defined as the portion of the gate dielectric 50A that overlaps with the area of the gate electrode (52, 54, 56). A first peripheral portion 50P and a second peripheral portion 50Q of the gate dielectric 50A are located on opposing sides of the center portion 50C of the gate dielectric 50A, and are not covered by the gate electrode (52, 54, 56), i.e., do not overlap with the area of the gate electrode (52, 54, 56).

While the present disclosure is described employing a particular embodiment of a layer stack for a gate electrode (52, 54, 56), it is understood that any different conductive material portion or any different conductive layer stack may be employed in lieu of the gate electrode (52, 54, 56) described herein. Such variations of the exemplary structure are expressly contemplated herein.

Figure 9A:
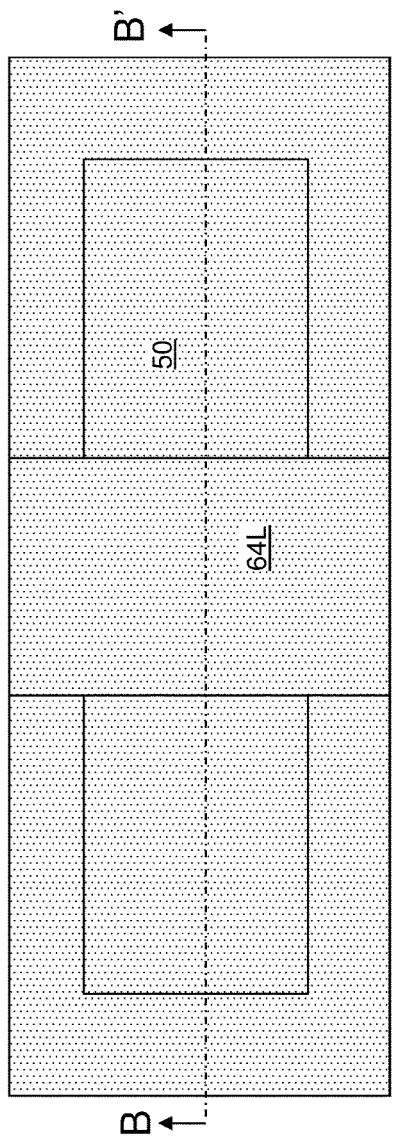
FIG. 9A is a top-down view of the exemplary structure after formation of a continuous dielectric gate liner layer and a continuous dielectric spacer material layer according to an embodiment of the present disclosure.
Figure 9B:
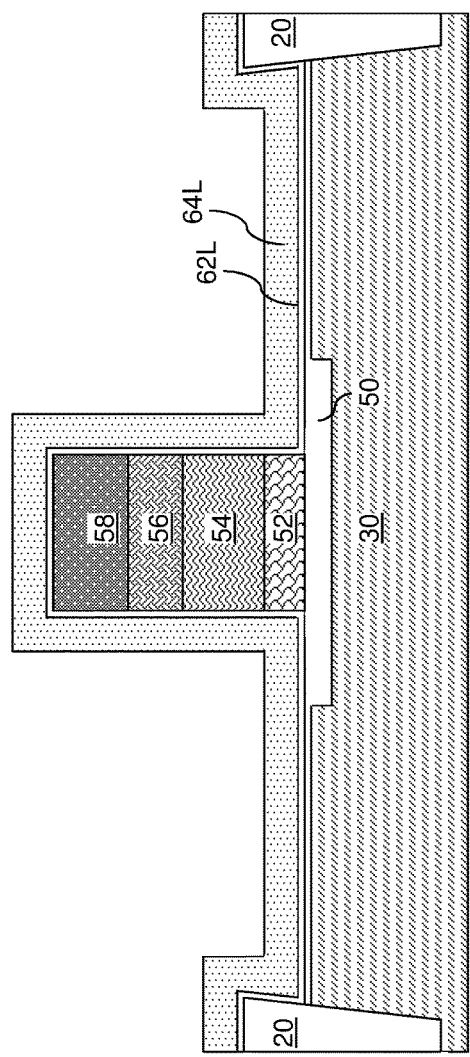
FIG. 9B is a vertical cross-sectional view of the exemplary structure of FIG. 9A along the vertical plane B-B'.

Referring to FIGS. 9A and 9B, a continuous dielectric gate liner layer 62L and a continuous dielectric spacer material layer 64L can be formed over, and around, the gate electrode (52, 54, 56) and over the semiconductor substrate 30. The continuous dielectric gate liner layer 62L includes a dielectric material such as silicon oxide, silicon oxynitride, silicon nitride, or a dielectric metal oxide. In one embodiment, the continuous dielectric gate liner layer 62L includes a material that is different from the material of the continuous dielectric material layer 50. The continuous dielectric gate liner layer 62L can be deposited by a conformal deposition process such as low pressure chemical vapor deposition. The thickness of the continuous dielectric gate liner layer 62L can be in a range from 1 nm to 10 nm, although lesser and greater thicknesses can also be employed.

The continuous dielectric spacer material layer 64L can be formed over the continuous dielectric gate liner layer 62L. The continuous dielectric spacer material layer 64L includes a dielectric material to be employed to subsequently form a dielectric gate spacer. For example, the continuous dielectric spacer material layer 64L can include silicon oxide and/or silicon nitride. The continuous dielectric spacer material layer 64L can be deposited by a conformal deposition process such as low pressure chemical vapor deposition (LPCVD). The thickness of the continuous dielectric spacer material layer 64L can be in a range from 10 nm to 300 nm (such as from 20 nm to 120 nm) although lesser and greater thicknesses can also be employed. The sum of the thickness of the continuous dielectric gate liner layer 62L and the thickness of the continuous dielectric spacer material layer 64L can be selected to match a target lateral offset distance between the gate electrode (52, 54, 56) and areas for implantation of dopants for formation of source and drain extension regions.

Referring to FIGS. 10A and 10B, an anisotropic etch process can be performed to etch horizontal portions of the continuous dielectric spacer material layer 64L. In one embodiment, the material of the continuous dielectric gate liner layer 62L may be different from the material of the continuous dielectric spacer material layer 64L, and the anisotropic etch may be selective to the material of the continuous dielectric gate liner layer 62L. In one embodiment, an overetch may be performed to remove portions of the continuous dielectric spacer material layer 64L around the shallow trench isolation structure 20. A remaining vertical portion of the continuous dielectric spacer material layer 64L laterally surrounds the gate electrode (52, 54, 56) and the gate cap dielectric 58, and is herein referred to as a dielectric gate spacer 64. The dielectric gate spacer 64 is shown schematically in FIG. 10B and may have a tapered upper surface typical of a sidewall spacer formed by anisotropic etching.

Physically exposed portions of the continuous dielectric gate liner layer 62L that are not covered by the dielectric gate spacer 64 can be removed by an etch process, which can be an isotropic etch or an anisotropic etch. In one embodiment, the physically exposed portion of the continuous dielectric gate liner layer 62L can be etched by an isotropic etch such as a wet etch. Collateral etching of the continuous dielectric material layer 50 during etching of the physically exposed portions of the continuous dielectric gate liner layer 62L can be avoided or minimized. In one embodiment, the isotropic etch process may be selective to the material of the continuous dielectric material layer 50 (i.e., selective to silicon oxide). In another embodiment, the isotropic etch process may be timed such that collateral etching of the continuous dielectric material layer 50 is avoided or minimized. A remaining portion of the continuous dielectric gate liner layer 62L comprises a dielectric gate liner 62. The dielectric gate liner 62 laterally surrounds the gate electrode (52, 54, 56), is laterally surrounded by the dielectric gate spacer 64, and has an outer periphery that is vertically coincident with an outer sidewall of the dielectric gate spacer 64. As used herein, a pair of vertical surfaces, a pair of lines, or a vertical surface and a line are "vertically coincident" if the two elements overlap in a top-down view, i.e., a plan view from above along a vertical direction. In one embodiment, the dielectric gate liner 62 can have an L-shaped vertical cross-sectional shape that includes a vertical portion having a uniform thickness and a horizontal portion including the same uniform thickness and adjoined to the vertical portion. The vertical portion of the dielectric gate liner 62 can contact sidewalls of the gate electrode (52, 54, 56) and the gate cap dielectric 58.

The dielectric gate spacer 64 is formed around the gate electrode (52, 54, 56). A region of the first peripheral portion 50P of the gate dielectric 50A and a region of the second peripheral portion 50Q of the gate dielectric 50 are physically exposed after formation of the dielectric gate spacer 64 and the dielectric gate liner 62

Referring to FIGS. 11A and 11B, a source extension region 32S and a drain extension region 32D can be formed within the semiconductor substrate by doping respective portions of the semiconductor substrate 30. The source extension region 32S can be formed through and directly under the first peripheral portion 50P of the gate dielectric 50A, and the drain extension region 32D can be formed through and directly under the second peripheral portion 50B of the gate dielectric 50A.

Specifically, dopants of a second conductivity type can be implanted into top surface portions of the semiconductor substrate 30 to form a source extension region 32S and a drain extension region 32D. The second conductivity type is the opposite of the first conductivity type. For example, if the first conductivity type is p-type, the second conductivity type is n-type and vice versa. The remaining portion of the semiconductor substrate 30 that underlies the continuous dielectric material layer 50 constitutes a body region 30B of a field effect transistor. Thus, the source extension regions 32S and the drain extension region 32D have a doping of the opposite type of the doping of the body region 30B, of which a surface portion constitutes a channel of the field effect transistor. A first p-n junction is formed at the interface between the source extension region 32S and the body region 30B, and a second p-n junction is formed at the interface between the drain extension region 32D and the body region 30B.

The average dopant concentration of the source extension region 32S and the drain extension region 32D can be in a range from $1.0 \times 10^{18}/cm^3$ to $1.0 \times 10^{20}/cm^3$, although lesser and greater dopant concentrations can also be employed. The depth of the horizontal portions of the p-n junctions can be in a range from 50 nm to 500 nm, although lesser and greater depths can also be employed.

Some dopant ions of the second conductivity type pass through the first and second peripheral portions (50P, 50Q) of the gate dielectric 50A during the ion implantation process. Thus, the source extension region 32S and the drain extension region 32D can be formed by implantation of dopants through the physically exposed regions of the first and second peripheral portions (50A, 50B) of the gate dielectric 50A and through the top surface of the semiconductor substrate 30 outside the trench 49 after formation of the dielectric gate spacer 64.

Further, some dopant ions of the second conductivity type are incorporated into regions of the first and second peripheral portions (50P, 50Q) of the gate dielectric 50A during the ion implantation process. Thus, the first peripheral portion 50P and the second peripheral portion 50Q of the gate dielectric 50A can be doped with the same species of electrical dopants as the source extension region 32S and the drain extension region 32D. For example, if the source extension region 32S and the drain extension region 32D are doped with P, As, or Sb, the regions of the first peripheral portion 50P and the second peripheral portion 50Q of the gate dielectric 50A that overlie the source extension region 32S and the drain extension region 32D can also be doped with P, As, or Sb. The center portion 50C of the gate dielectric 50A may not be doped with electrical dopants of any conductivity type. In other words, the center portion 50C of the gate dielectric 50A may be substantially free of any electrical dopants. As used herein, an element is "substantially free" of any electrical dopants if the element does not include any electrical dopant atom or includes electrical dopant atoms at a trace level such as less than 1 part per billion.

Referring to FIGS. 12A and 12B, a photoresist layer (not shown) may be applied over the exemplary structure and patterned to form openings in areas that within the portions of the source extension region 32S and the drain extension region 32D that do not underlie the gate dielectric 50A. An opening through the photoresist layer can be formed over a center portion of the source extension region 32S that is laterally offset from the gate dielectric 50A, and another opening through the photoresist layer can be formed over a center portion of the drain extension region 32D that is laterally offset from the gate dielectric 50A.

Dopants of the second conductivity type can be implanted through the openings in the photoresist layer to form a source region 34S that is embedded within the source extension region 32S and a drain region 34D that is embedded within the drain extension region 32D. The average dopant concentration of the second conductivity type dopant within the source region 34S and the drain region 34D can be in a range from $5.0 \times 10^{19}/cm^3$ to $2.0 \times 10^{21}/cm^3$, although lesser and greater dopant concentrations can also be employed. The depth of ion implantation can be selected such that the bottom surfaces of the source region 34S and the drain region 34D are formed above the bottom surfaces of the source extension region 32S and the drain extension region 32D.

In one embodiment, the straggle of the implanted dopant ions of the second conductivity type below the bottom surfaces of the source extension region 32S and the drain extension region 32D as formed at the processing steps of FIGS. 11A and 11B may cause the volume of the source extension region 32S and the drain extension region 32D to expand downward from underneath the source region 34S and the drain region 34D. In this case, each p-n junction between the body region 30B and the source and drain extension regions (32S, 32D) may have a recessed region having a greater depth from the topmost surface of the semiconductor substrate (30B, 32S, 32D, 34S, 34D) than portions of the bottom surfaces of the source and drain extension regions (32S, 32D) that underlie the gate dielectric 50A. The source region 34S and the drain region 34D are laterally spaced from the gate dielectric 50A, and are adjoined to the top surface of the semiconductor substrate (30B, 32S, 32D, 34S, 34D).

Figure 13A:
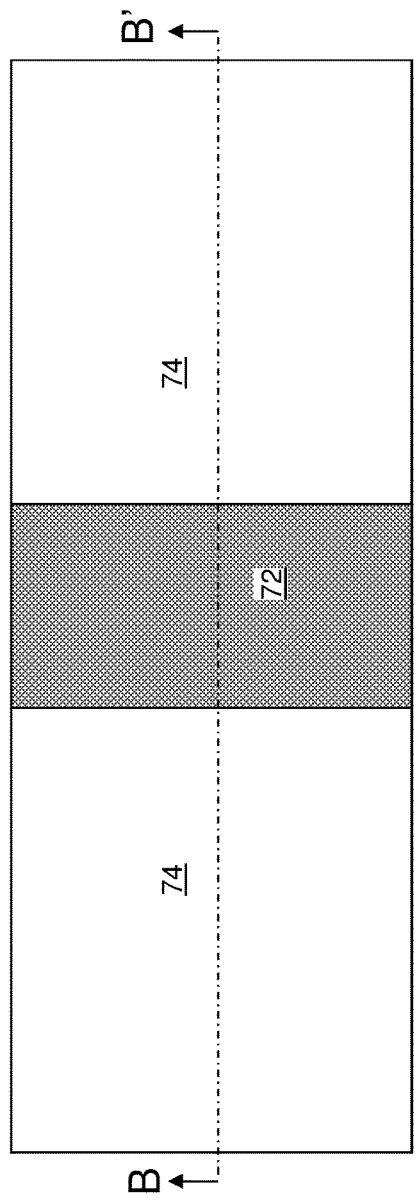
FIG. 13A is a top-down view of the exemplary structure after formation of a dielectric diffusion barrier layer and a planarization dielectric layer according to an embodiment of the present disclosure.
Figure 13B:
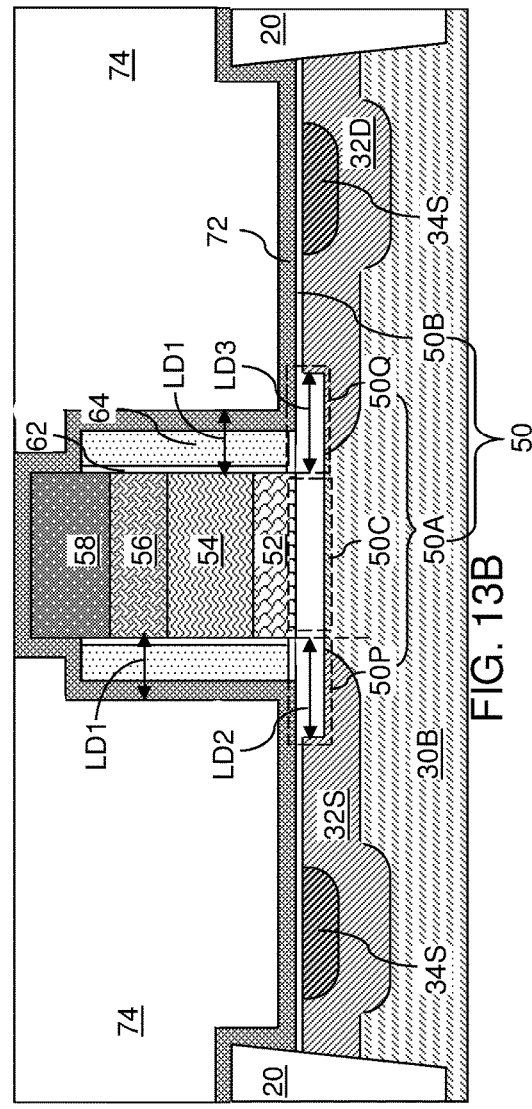
FIG. 13B is a vertical cross-sectional view of the exemplary structure of FIG. 13A along the vertical plane B-B'.

Referring to FIGS. 13A and 13B, a dielectric diffusion barrier layer 72 can be optionally deposited as a continuous material layer. The dielectric diffusion barrier layer 72 includes a dielectric material that can function as a diffusion barrier layer for metallic impurities and non-metallic impurities (such as fluorine, carbon, hydrogen, and oxygen). The dielectric diffusion barrier layer 72 can be formed over, and around, the gate electrode (52, 54, 56) and directly on top surfaces of the first and second peripheral portions (50P, 50Q) of the gate dielectric 50A. For example, the dielectric diffusion barrier layer 72 can include silicon nitride. The dielectric diffusion barrier layer 72 can be deposited by a conformal deposition process or a non-conformal deposition process. The thickness of the dielectric diffusion barrier layer 72, as measured over the source region 34S and the drain region 34D, can be in a range from 5 nm to 100 nm, although lesser and greater thicknesses can also be employed. In one embodiment, the dielectric diffusion barrier layer 72 may be tensile-stress-generating or compressive-stress-generating.

A planarization dielectric material can be deposited over the gate electrode (52, 54, 56) and the semiconductor substrate (30B, 32S, 32D, 34S, 34D). If the dielectric diffusion barrier layer 72 is formed, the planarization dielectric material can be deposited directly on the dielectric diffusion barrier layer 72. The planarization dielectric material includes a self-planarizing dielectric material (such as a spin-on glass (SOG) that includes a flowable hydrogen-containing silicon oxide material) or a dielectric material that can be planarized by chemical mechanical planarization (such as a doped silicate glass or an undoped silicate glass). The planarized planarization dielectric material forms a planarization dielectric layer 74 having a planar top surface.

If chemical mechanical planarization is employed to planarize the planarization dielectric material, the portion of the dielectric diffusion barrier layer 72 overlying the gate electrode (52, 54, 56) can be employed as a stopping structure. In this case, the top surface of the planarization dielectric layer 74 can be within the same horizontal plane as the top most surface of the dielectric diffusion barrier layer 72. If the planarization dielectric material is self-planarizing, the top surface of the planarization dielectric layer 74 can be located above the horizontal plane including the top surface of the dielectric diffusion barrier layer 72.

In one embodiment, a portion of the planarization dielectric layer 74 that laterally surrounds the gate electrode (52, 54, 56) can include substantially vertical sidewalls at a level of the gate electrode (52, 54, 56). In one embodiment, a first lateral distance LD1 between the gate electrode (52, 54, 56) and one of the vertical sidewalls of the planarization dielectric layer 74 is less than a second lateral distance LD2 between the gate electrode (52, 54, 56) and a vertical sidewall of the first peripheral portion 50P of the gate dielectric 50A that contacts the source extension region 32S. Further, the first lateral distance LD1 between the gate electrode (52, 54, 56) and one of the vertical sidewalls of the planarization dielectric layer 74 is less than a third lateral distance LD3 between the gate electrode (52, 54, 56) and a vertical sidewall of the second peripheral portion 50Q of the gate dielectric 50A that contacts the drain extension region 32D.

Figure 14:
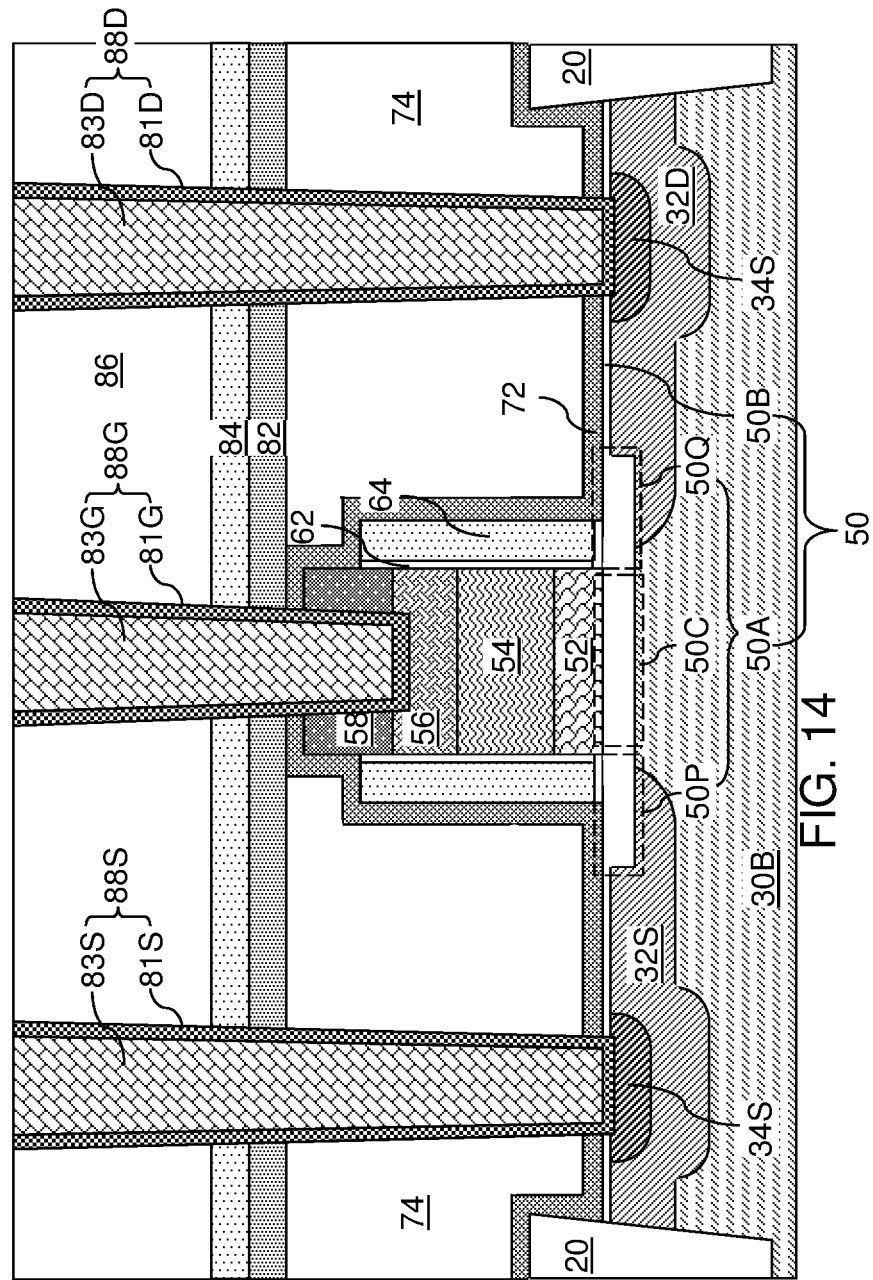
FIG. 14 is a vertical cross-sectional view of the exemplary structure after formation of contact via structures according to an embodiment of the present disclosure.

Referring to FIG. 14, additional contact level dielectric layers (82, 84, 86) can be formed over the planarization dielectric layer 74. The additional contact level dielectric layers (82, 84, 86) can include, for example, a contact level silicon nitride layer 82, a contact level silicon oxide layer 84, and a contact level dielectric material layer 86 including a dielectric material such as doped silicate glass, undoped silicate glass, organosilicate glass, or a porous variant thereof. The additional contact level dielectric layers (82, 84, 86) may be formed by chemical vapor deposition and/or spin coating. The thickness of each layer within the additional contact level dielectric layers (82, 84, 86) may be suitably selected, and may be, for example, in a range from 30 nm to 600 nm, although lesser and greater thicknesses can also be employed.

Contact via cavities can be formed through the additional contact level dielectric layers (82, 84, 86), the planarization dielectric layer 74, the dielectric diffusion barrier layer 72, and the gate cap dielectric 58 by application and lithographic patterning of a photoresist layer (not shown) to form openings therein, and by a subsequent anisotropic etch that transfers the pattern of the openings in the photoresist layer through the various dielectric material layers (86, 84, 82, 74, 72) and the gate cap dielectric 58. The photoresist layer can be removed, for example, by ashing.

At least one conductive material can be deposited in the contact via cavities to form various contact via structures (88S, 88D, 88G). For example, a metallic liner (such as a conductive metal nitride liner including TiN, TaN, or WN) and a metallic fill material (such as W, Ti, Co, Cu, Ru, or Al) may be sequentially deposited in the contact via cavities, and excess portions of the metallic liner and the metallic fill material can be removed from above the additional contact level dielectric layers (82, 84, 86) by a planarization process such as chemical mechanical planarization or a recess etch. Each contiguous set of remaining conductive material portions constitutes a contact via structure (88S, 88D, or 88G). For example, the contact via structures (88S, 88D, 88G) can include a source contact via structure 88S (i.e., source electrode) that includes a source metallic liner 81S and a source metallic fill material portion 83S, a drain contact via structure 88D (i.e., drain electrode) that includes a drain metallic liner 81D and a drain metallic fill material portion 83D, and a gate contact via structure 88G (i.e., gate contact) that includes a gate metallic liner 81G and a gate metallic fill material portion 83G.

Referring collectively to all of the drawings of the present disclosure, the exemplary structure of the present disclosure can include a semiconductor device comprising a field effect transistor. The field effect transistor can include: a trench 49 located in an upper portion of a semiconductor substrate (30B, 32S, 32D, 34S, 34D) and having a uniform depth within a periphery (defined by the bottom edges of the sidewalls of the trench 49) thereof; a continuous dielectric material layer 50 including a gate dielectric 50A that fills an entire volume of the trench 49; a gate electrode (52, 54, 56) overlying a center portion 50C of the gate dielectric 50A, wherein a first peripheral portion 50P and a second peripheral portion 50Q of the gate dielectric 50A are located on opposing sides of the center portion 50C of the gate dielectric 50A, and do not have an areal overlap with the gate electrode (52, 54, 56) in a plan view; a source extension region 32S located within the semiconductor substrate (30B, 32S, 32D, 34S, 34D) and contacting a first vertical sidewall of the gate dielectric 50A located on the first peripheral portion 50P; and a drain extension region 32D located within the semiconductor substrate (30B, 32S, 32D, 34S, 34D) and contacting a second vertical sidewall of the gate dielectric 50A located on the second peripheral portion 50Q.

In one embodiment, the gate dielectric 50A can have a uniform thickness throughout, and the uniform thickness can be greater than the uniform depth of the trench 49. In one embodiment, the first peripheral portion 50P and the second peripheral portion 50Q of the gate dielectric 50A are doped with the same species of electrical dopants as the source extension region 32S and the drain extension region 32D. In some embodiments, the gate dielectric 50A comprises silicon oxide having an impurity carbon concentration of at least $1.0 \times 10^{18}/cm^3$. In one embodiment, the continuous dielectric material layer 50 further comprises a semiconductor oxide layer 50B adjoined to the first and second peripheral portions (50P, 50Q) of the gate dielectric 50A, having a lesser thickness than the gate dielectric 50A, and is substantially free of carbon atoms.

In one embodiment, the field effect transistor further comprises: a source region 34S having a greater dopant concentration than the source extension region 32S and contacting a first portion of a bottom surface of the semiconductor oxide layer 50B and laterally spaced from the gate dielectric 50A; and a drain region 34D having a greater dopant concentration than the drain extension region 32D and contacting a second portion of a bottom surface of the semiconductor oxide layer 50B and laterally spaced from the gate dielectric 50A.

In one embodiment, sidewalls of the trench 49 can vertically extend from the top surface of the semiconductor substrate (30B, 32S, 32D, 34S, 34D) to the horizontal bottom surface of the trench 49, and collectively define a total lateral extent of the trench 49. In one embodiment, the entirety of the top surface of the gate dielectric 50A can be located in a horizontal plane.

In one embodiment, the source extension region 32S contacts a portion of the bottom surface of the first peripheral portion 50P of the gate dielectric 50A; and a drain extension region 32D contacts a portion of the bottom surface of the second peripheral portion 50Q of the gate dielectric 50A. A dielectric gate spacer 64 can laterally surround the gate electrode (52, 54, 56). The first and second vertical sidewalls of the gate dielectric 50A can be laterally spaced from the gate electrode by a greater lateral separation distance (such as the second lateral distance LD2 and the third lateral distance LD3 shown in FIG. 13B) than outer sidewalls of the dielectric gate spacer 64 are from the gate electrode (52, 54, 56) (which is the same as the sum of the lateral thickness of the dielectric gate liner 62 and the lateral thickness of the dielectric gate spacer 64).

A planarization dielectric layer 64 can have a planar top surface that is above a horizontal plane including the top surface of the gate electrode (52, 54, 56). The planarization dielectric layer 64 can include substantially vertical sidewalls at a level of the gate electrode (52, 54, 56). A lateral distance (such as the first lateral distance LD1 illustrated in FIG. 13B) between the vertical sidewalls and the gate electrode (52, 54, 56) can be less than a lateral distance (such as the second lateral distance LD2 illustrated in FIG. 13B) between the first vertical sidewall of the gate dielectric 50A (that contacts the source extension region 32S) and the gate electrode (52, 54, 56).

In one embodiment, a dielectric gate liner 62 can be provided, which includes a vertical portion that laterally surrounds the gate electrode (52, 54, 56) and is laterally surrounded by the dielectric gate spacer 64, and further includes a horizontal portion that contacts portions of the gate dielectric 50A and underlies the dielectric gate spacer 64. An outer periphery of the dielectric gate liner 62 cam be vertically coincident with an outer sidewall of the dielectric gate spacer 64.

In one embodiment, a dielectric diffusion barrier layer 72 can be provided, which continuously extends over, and laterally surrounds, the gate electrode (52, 54, 56) and contacts portions of top surfaces of the first and second peripheral portions (50P, 50Q) of the gate dielectric 50A.

The field effect transistor of one or more embodiments of the present disclosure can be used in any semiconductor device. In one embodiment, the field effect transistor can be used as a peripheral (e.g., driver) high voltage transistor of a memory device. Memory devices include NAND and resistive RAM (ReRAM) memory devices. For example, the field effect transistor can be used as a word line select transistor for a three dimensional NAND device having vertically oriented channels (i.e., extending perpendicular to the top surface of the substrate) and charge storage regions located adjacent to the channels (e.g., vertical NAND). Non-limiting examples of vertical NAND devices are described in U.S. published patent application numbers 2016/0351709 A1 (published Dec. 1, 2016), and 2016/0365351 A1 (published Dec. 15, 2016), and in U.S. Pat. No. 9,449,987 B1 issued Sep. 20, 2016, and U.S. Pat. No. 9,305,934 B1 issued Apr. 5, 2016, each of which is incorporated herein by reference in its entirety.

The field effect transistor of one or more embodiments of the present disclosure can provide a reduced electrical field in the portions of the gate dielectric 50A that underlies dielectric gate spacer 64 because the gate dielectric 50A laterally extends farther outward from the outer sidewalls of the dielectric gate spacer 64. In other words, the presence of the peripheral portions of the gate dielectric 50A on the outer sides of the dielectric gate spacer 64 increases the distance within the gate dielectric 50A over which the applied electrical potential difference can be distributed between the bottom surface of the gate electrode (52, 54, 56) and the source and drain extension regions (32S, 32D). Thus, a field effect transistor of the present disclosure can have a greater breakdown voltage than a conventional field effect transistor having similar dimensions as the field effect transistor of the present disclosure but not including the peripheral portions of a gate dielectric that laterally extends farther outward than the outer sidewalls of a dielectric gate spacer. Alternatively, the field effect transistor of one or more of the embodiments of the present disclosure can be scaled down relative to prior art field effect transistors, while providing the same or higher breakdown voltage due to the presence of the peripheral portions of a gate dielectric 50A that laterally extends farther outward than the outer sidewalls of a dielectric gate spacer 64. Thus, the structures and methods of one or more embodiments of the present disclosure provide a field effect transistor that can be optimized for high voltage operation and providing superior performance compared to prior art high voltage field effect transistors.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A field effect transistor, comprising:
   a trench located in an upper portion of a semiconductor substrate;
   a continuous dielectric material layer including a gate dielectric that fills an entire volume of the trench and further including a semiconductor oxide layer that is adjoined to the gate dielectric, has a lesser thickness than the gate dielectric, and is substantially free of carbon atoms;
   a gate electrode overlying a center portion of the gate dielectric, wherein a first peripheral portion and a second peripheral portion of the gate dielectric are located on opposing sides of the center portion of the gate dielectric, and do not have an areal overlap with the gate electrode;
   a source extension region located within the semiconductor substrate and contacting a first vertical sidewall of the first peripheral portion of the gate dielectric;
   a drain extension region located within the semiconductor substrate and contacting a second vertical sidewall of the second peripheral portion of the gate dielectric;
   a source region having a greater dopant concentration than the source extension region and contacting the source extension region and a first portion of a bottom surface of the semiconductor oxide layer and laterally spaced from the gate dielectric; and
   a drain region having a greater dopant concentration than the drain extension region and contacting the drain extension region and a second portion of a bottom surface of the semiconductor oxide layer and laterally spaced from the gate dielectric.

2. The field effect transistor of claim 1, wherein:
   the trench has a uniform depth;
   the gate dielectric has a uniform thickness throughout; and
   the uniform thickness of the gate dielectric is greater than the uniform depth of the trench.

3. The field effect transistor of claim 1, wherein the first peripheral portion and the second peripheral portion of the gate dielectric are doped with a same species of electrical dopants as the source extension region and the drain extension region.

4. The field effect transistor of claim 1, wherein sidewalls of the trench vertically extend from a top surface of the semiconductor substrate to a horizontal bottom surface of the trench and collectively define a total lateral extent of the trench.

5. The field effect transistor of claim 1, wherein an entirety of a top surface of the gate dielectric is located in a horizontal plane.

6. The field effect transistor of claim 1, wherein:
   the source extension region contacts a portion of a bottom surface of the first peripheral portion of the gate dielectric; and
   a drain extension region contacts a portion of a bottom surface of the second peripheral portion of the gate dielectric.

7. The field effect transistor of claim 1, further comprising a dielectric gate spacer laterally surrounding the gate electrode, wherein the first and second vertical sidewalls of the gate dielectric are laterally spaced from the gate electrode by a greater lateral separation distance than outer sidewalls of the dielectric gate spacer are from the gate electrode.

8. The field effect transistor of claim 7, further comprising a planarization dielectric layer that has:
   a planar top surface located above a horizontal plane that includes a top surface of the gate electrode; and
   substantially vertical sidewalls located at a level of the gate electrode,
   wherein a lateral distance between the substantially vertical sidewalls of the planarization dielectric layer and the gate electrode is less than a lateral distance between the first vertical sidewall of the gate dielectric and the gate electrode.

9. The field effect transistor of claim 7, further comprising a dielectric gate liner comprising:
   a vertical portion that laterally surrounds the gate electrode and is laterally surrounded by the dielectric gate spacer; and
   a horizontal portion that contacts portions of the gate dielectric and underlies the dielectric gate spacer,
   wherein an outer periphery of the dielectric gate liner is vertically coincident with an outer sidewall of the dielectric gate spacer.

10. The field effect transistor of claim 1, further comprising a dielectric diffusion barrier layer that continuously extends over, and laterally surrounds, the gate electrode, wherein:
    the dielectric diffusion barrier directly contacts portions of top surfaces of the first and second peripheral portions of the gate dielectric;
    the dielectric diffusion barrier directly contacts an entirety of a top surface of the semiconductor oxide layer; and
    the dielectric diffusion barrier comprises silicon nitride.

11. The field effect transistor of claim 10, further comprising:
    a source contact via structure that includes a source metallic liner and a source metallic fill material portion and directly contacting a sidewall of a first opening through the semiconductor oxide layer and in electrical contact with the source region; and
    a drain contact via structure that includes a drain metallic liner and a drain metallic fill material portion and directly contacting a sidewall of a second opening through the semiconductor oxide layer and in electrical contact with the drain region.

12. The field effect transistor of claim 11, wherein:
the source contact via structure directly contacts a sidewall of a first opening through the dielectric diffusion barrier layer; and
the drain contact via structure directly contacts a sidewall of a second opening through the dielectric diffusion barrier layer.

13. The field effect transistor of claim 12, wherein:
a top surface of the source region a top surface of the drain region are coplanar with a bottom surface of the semiconductor oxide layer;
the source contact via structure directly contacts the source region; and
the drain contact via structure directly contacts the drain region.

14. The field effect transistor of claim 10, further comprising a shallow trench isolation structure that comprises a dielectric fill material and laterally encloses the continuous dielectric material layer,
wherein:
the shallow trench isolation structure comprises a pair of lengthwise sidewalls and a pair of widthwise sidewalls; and
an entire periphery of the continuous dielectric material layer adjoins a respective sidewall among the pair of lengthwise sidewalls and the pair of widthwise sidewalls of the shallow trench isolation structure.

15. The field effect transistor of claim 14, wherein:
the gate dielectric is laterally spaced from each of the pair of widthwise sidewalls and adjoins the pair of lengthwise sidewalls of the shallow trench isolation structure; and
the dielectric diffusion barrier layer directly contacts each of the pair of widthwise sidewalls of the shallow trench isolation structure.

16. The field effect transistor of claim 1, wherein:
the semiconductor oxide layer is adjoined to sidewalls of the gate dielectric, and the semiconductor oxide layer does not extend above any portion of the gate dielectric; and
the first peripheral portion and the second peripheral portion of the gate dielectric are adjoined to a respective portion of the semiconductor oxide layer.

* * * * *